United States Patent
Yang et al.

(10) Patent No.: US 12,414,477 B2
(45) Date of Patent: Sep. 9, 2025

(54) MAGNETIC RANDOM ACCESS MEMORY AND MANUFACTURING METHOD THEREOF

(71) Applicant: TAIWAN SEMICONDUCTOR MANUFACTURING COMPANY, LTD., Hsinchu (TW)

(72) Inventors: Chih-Hsin Yang, Hsinchu (TW); Dian-Hau Chen, Hsinchu (TW); Yen-Ming Chen, Chu-Pei (TW); Yu-Jen Wang, Hsinchu (TW); Chen-Chiu Huang, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 506 days.

(21) Appl. No.: 17/489,352

(22) Filed: Sep. 29, 2021

(65) Prior Publication Data

US 2022/0328759 A1    Oct. 13, 2022

Related U.S. Application Data

(60) Provisional application No. 63/172,810, filed on Apr. 9, 2021.

(51) Int. Cl.
| | |
|---|---|
| *G11C 11/16* | (2006.01) |
| *H10B 61/00* | (2023.01) |
| *H10N 50/01* | (2023.01) |
| *H10N 50/10* | (2023.01) |

(Continued)

(52) U.S. Cl.
CPC ............ *H10N 50/01* (2023.02); *G11C 11/161* (2013.01); *H10B 61/00* (2023.02); *H10B 61/10* (2023.02); *H10B 61/22* (2023.02); *H10N 50/10* (2023.02); *H10N 50/80* (2023.02); *H10N 50/85* (2023.02)

(58) Field of Classification Search
CPC ........ H10N 50/01; H10N 50/10; H10N 50/80; H10N 50/85; H10B 61/00; H10B 61/10
See application file for complete search history.

(56) References Cited

U.S. PATENT DOCUMENTS

| | | | |
|---|---|---|---|
| 10,727,401 B2 | 7/2020 | Niu et al. | |
| 2016/0359101 A1* | 12/2016 | Kuo | ................. H10N 50/80 |
| 2018/0248112 A1* | 8/2018 | Chuang | ................. H10N 50/10 |

(Continued)

*Primary Examiner* — Kretelia Graham
*Assistant Examiner* — William Henry Anderson
(74) *Attorney, Agent, or Firm* — STUDEBAKER BRACKETT PLLC

(57) ABSTRACT

In a method of manufacturing a semiconductor device including a magnetic random access memory (MRAM) cell, a first layer made of a conductive material is formed over a substrate. A second layer for a magnetic tunnel junction (MTJ) stack is formed over the first conductive layer. A third layer is formed over the second layer. A first hard mask pattern is formed by patterning the third layer. The MTJ stack is formed by patterning the second layer by an etching operation using the first hard mask pattern as an etching mask. The etching operation stops at the first layer. A sidewall insulating layer is formed over the MTJ stack. After the sidewall insulating layer is formed, a bottom electrode is formed by patterning the first layer to form the MRAM cell including the bottom electrode, the MTJ stack and the first hard mask pattern as an upper electrode.

20 Claims, 26 Drawing Sheets

(51) Int. Cl.
*H10N 50/80* (2023.01)
*H10N 50/85* (2023.01)

(56) References Cited

U.S. PATENT DOCUMENTS

| | | | |
|---|---|---|---|
| 2019/0157344 A1* | 5/2019 | Wei | H10N 50/10 |
| 2020/0006075 A1* | 1/2020 | Wang | H01L 21/823468 |
| 2020/0035908 A1* | 1/2020 | Ku | H01F 41/34 |
| 2020/0083441 A1* | 3/2020 | Huang | H10N 50/10 |
| 2021/0098248 A1* | 4/2021 | Wu | H01L 21/0234 |
| 2021/0143324 A1* | 5/2021 | Lin | H10N 50/80 |
| 2022/0199898 A1* | 6/2022 | Hashemi | H01F 10/329 |
| 2023/0165157 A1* | 5/2023 | Yang | H10N 50/01 257/421 |

* cited by examiner

MAGNETIC RANDOM ACCESS MEMORY AND MANUFACTURING METHOD THEREOF

RELATED APPLICATION

This application claims priority to U.S. Provisional Patent Application No. 63/172,810 filed on Apr. 9, 2021, the entire contents of which are incorporated herein by reference.

BACKGROUND

A magnetic random access memory (MRAM) is a device based on a magnetic tunnel junction cell formed with a semiconductor device, and offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers which are separated by a thin insulating barrier, and operates by tunneling of electrons between the two ferromagnetic layers through the insulating barrier.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C; A and B; A and C; B and C, or A, B and C), and does not mean one element from A, one element from B and one element from C, unless otherwise described.

Figure 1B:
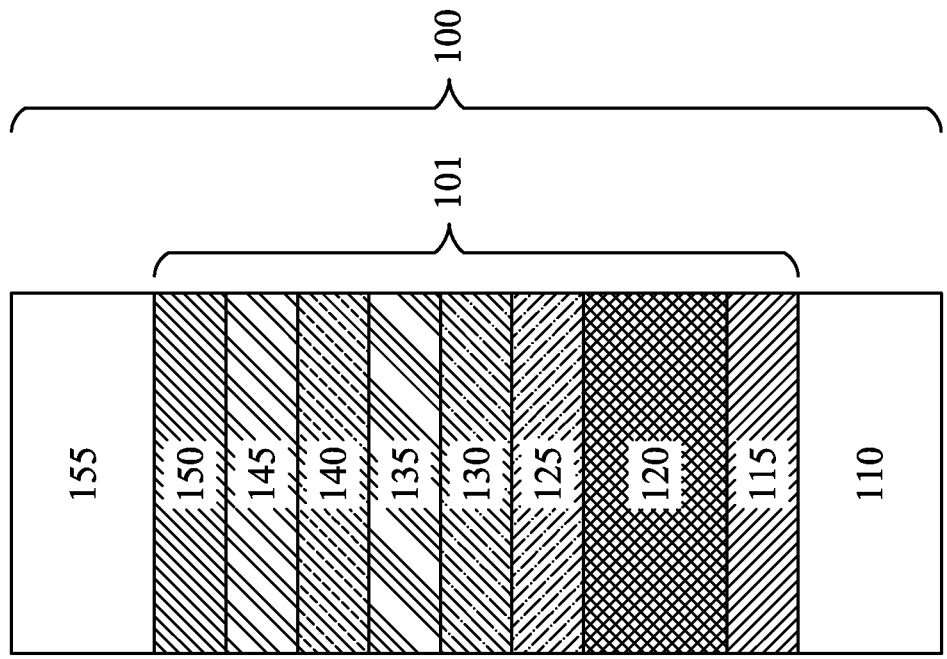
FIG. 1B is a schematic cross sectional view of the MTJ film stack according to an embodiment of the present disclosure.
Figure 1A:
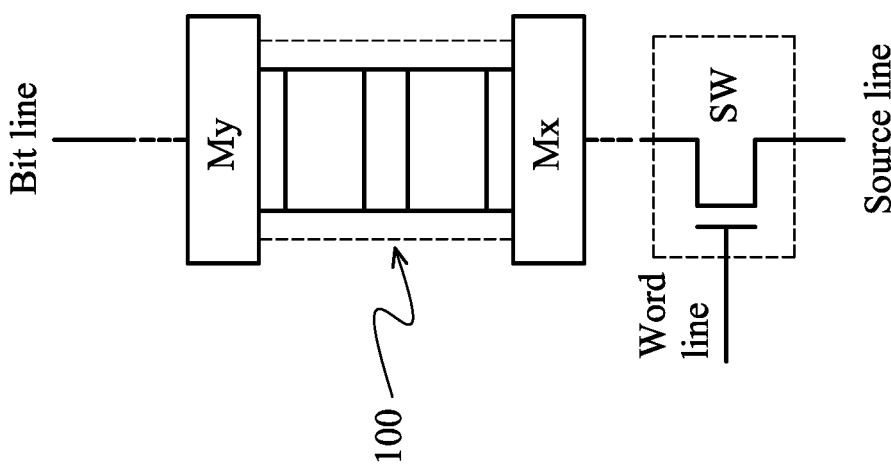
FIG. 1A is a schematic view of an MTJ MRAM cell according to an embodiment of the present disclosure.

FIG. 1A is a schematic view of a MTJ MRAM cell according to an embodiment of the present disclosure, and FIG. 1B is a schematic cross sectional view of the MTJ film stack. The MTJ cell 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. The upper metal layer My is coupled to a bit line. In some embodiments, the switching device SW is disposed between the upper metal layer My and the bit line. In some embodiments, the upper metal layer My is the bit line.

The MTJ cell 100 shown in FIG. 1B includes a first electrode layer 110 coupled to the lower metal layer Mx and a second electrode layer 155 coupled to the upper metal layer My. An MTJ film stack 101 is disposed between the first electrode layer 110 and the second electrode layer 155.

The MTJ film stack (MTJ functional layer) 101 includes a first pinned magnetic layer 130, a free magnetic layer 140, and a tunneling barrier layer 135 made of a non-magnetic material and disposed between the first pinned magnetic layer 130 and the free magnetic layer 140. The free magnetic layer 140 and the first pinned magnetic layer 130 include one or more ferromagnetic materials that can be magnetically oriented, respectively. The first pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the first pinned magnetic layer 130 is in a range from about 0.8 nm to about 2.0 nm.

The tunneling barrier layer 135 includes a relatively thin oxide layer capable of electrically isolating the free magnetic layer 140 from the first pinned magnetic layer 130 at low potentials and capable of conducting current through electron tunneling at higher potentials. In some embodiments, the tunneling barrier layer 135 includes magnesium oxide (MgO) having a thickness in a range from about 0.5 nm to about 1.2 nm.

The MTJ film stack 101 further includes an antiferromagnetic layer 125, as shown in FIG. 1B. The anti-ferromagnetic layer 125 is used to fix the magnetic orientation of the first pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ film stack 101 further includes a second pinned magnetic layer 120 including one or more magnetic materials, as shown in FIG. 1B.

The first electrode layer 110 is formed on the lower metal layer Mx made of, for example, Cu, Al, W, Co, Ni, and/or an alloy thereof; and the upper metal layer My made of, for example, Cu, Al, W, Co, Ni, and/or an alloy thereof, is formed on the second electrode layer 155.

Figure 2A:
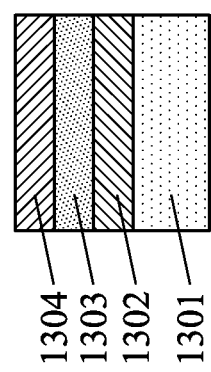
FIGS. 2A, 2B and 2C show schematic cross sectional views of magnetic layers of the MTJ film stack according to an embodiment of the present disclosure.

The first pinned magnetic layer 130 includes multiple layers of magnetic materials. In some embodiments, as shown in FIG. 2A, the first pinned magnetic layer 130 includes four layers 1301, 1302, 1303 and 1304, where the uppermost layer 1304 is in contact with the tunneling barrier layer 135 and the bottommost layer 1301 is in contact with the antiferromagnetic layer 125. In some embodiments, the bottommost layer 1301 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the bottommost layer 1301 is in a range from about 2.0 nm to about 5.0 nm in some embodiments. The layer 1302 includes a cobalt layer having a thickness in a range from about 0.4 nm to about 0.6 nm. In certain embodiments, the bottommost layer 1301 includes the cobalt layer and the layer 1302 is the multilayer of the cobalt layers and the platinum layers as set forth above. In this disclosure, an "element" layer generally means that the content of the "element" is more than 99%.

The layer 1303 is a spacer layer. The thickness of the spacer layer 1303 is in a range from about 0.2 nm to about 0.5 nm in some embodiments.

The uppermost layer 1304 includes a cobalt iron boron (CoFeB) layer, a cobalt/palladium (CoPd) layer and/or a cobalt iron (CoFe) layer. The thickness of the layer 1304 is in a range from about 0.8 nm to about 1.5 nm in some embodiments.

Figure 2B:
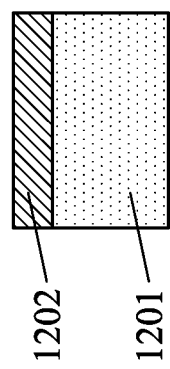

The second pinned magnetic layer 120 includes multiple layers of magnetic materials in some embodiments. In some embodiments, as shown in FIG. 2B, the second pinned magnetic layer 120 includes two layers 1201 and 1202, where the upper layer 1202 is in contact with the antiferromagnetic layer 125. In some embodiments, the lower layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the lower layer 1201 is in a range from about 5.0 nm to about 10.0 nm in some embodiments. The upper layer 1202 includes a cobalt layer having a thickness in a range from about 0.4 nm to about 0.6 nm.

Figure 2C:
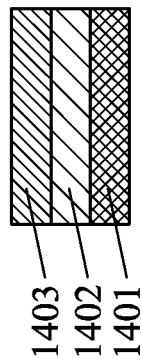

The free magnetic layer 140 includes a cobalt iron boron (CoFeB) layer, a cobalt/palladium (CoPd) layer and/or a cobalt iron (CoFe) layer having a thickness in a range from about 1.0 nm to about 2.0 nm in some embodiments. In other embodiments, the free magnetic layer 140 includes multiple layers of magnetic materials. In some embodiments, as shown in FIG. 2C, the free magnetic layer 140 includes three layers 1401, 1402 and 1403, where the lower layer 1401 is in contact with the tunneling barrier layer 135. The lower and upper layers 1401 and 1403 are a cobalt iron boron (CoFeB) layer, a cobalt/palladium (CoPd) layer and/or a cobalt iron (CoFe) layer having a thickness in a range from about 1.0 nm to about 2.0 nm in some embodiments. The middle layer 1402 is a spacer layer. The thickness of the spacer layer 1402 is in a range from about 0.2 nm to about 0.6 nm in some embodiments.

In some embodiments, the spacer layer 1303 and/or the spacer layer 1402 include an iridium layer and/or a binary alloy layer of iridium and tantalum. A spacer layer for the MTJ film stack has a super smooth surface morphology, high electric conductivity, and is substantially free from diffusion issues in some embodiments. Further, the spacer layer should also be tolerant to a low level of oxidation without significant degradation of its conductivity. The thickness of the spacer layers 1303 and/or 1402 is in a range from about 0.1 nm to about 10 nm in some embodiments, and is in a range from about 0.5 nm to about 5.0 nm in other embodiments.

The MTJ film stack 101 further includes a seed layer 115 formed on the first electrode layer 110, a capping layer 145 formed on the free magnetic layer 140, and a diffusion barrier layer 150 formed on the capping layer 145, as shown in FIG. 1B. The capping layer 145 includes a dielectric material, such as magnesium oxide or aluminum oxide, and has a thickness in a range from about 0.5 nm to about 1.5 nm in some embodiments. In some embodiments, the diffusion barrier layer 150 includes a metallic material, such as Ru, Ta, Mo or other suitable material, and has a thickness in a range from about 0.5 nm to about 1.5 nm. In some embodiments, one or both of the capping layer 145 and the diffusion barrier layer 150 are not used. In some embodiments, the seed layer 115 is made of one or more of iridium (Ir), tantalum (Ta), molybdenum (Mo), cobalt (Co), nickel (Ni), ruthenium (Ru) or platinum (Pt) or an alloy thereof.

The first electrode layer 110 includes a conductive material, such as a metal (e.g., Ta, Mo, Co, Pt, Ni), to reduce the resistance for programming. The second electrode layer 155 also includes a conductive material, such as a metal, to reduce the resistivity during reading.

The pinned magnetic layer, the free magnetic layer and the antiferromagnetic layer can be formed by physical vapor deposition (PVD), molecular beam epitaxy (MBE), pulsed laser deposition (PLD), atomic layer deposition (ALD), electron beam (e-beam) epitaxy, chemical vapor deposition (CVD), or derivative CVD processes, including low pressure CVD (LPCVD), ultrahigh vacuum CVD (UHVCVD), reduced pressure CVD (RPCVD), or any combinations thereof, or any other suitable film deposition method. The tunneling barrier layer and the diffusion barrier layer can also be formed by CVD, PVD or ALD or any other suitable film deposition method.

FIGS. 3A-3D show a memory operation of MTJ cell. As shown in FIGS. 3A-3D, the MTJ cell includes a pinned magnetic layer 10, a tunneling barrier layer 15 and a free magnetic layer 20. The pinned magnetic layer 10 corresponds to the first pinned magnetic layer 130 or the combination of the second pinned magnetic layer 120, the antiferromagnetic layer 125 and the first pinned magnetic layer 130 of FIG. 1B. The tunneling barrier layer 15 corresponds to the tunneling barrier layer 135 of FIG. 1B and the free magnetic layer 20 corresponds to the free magnetic layer 140 of FIG. 1B. In FIGS. 3A-3D, the remaining layers are omitted. A current source 30 is coupled to the MTJ structure in series.

Figure 3B:
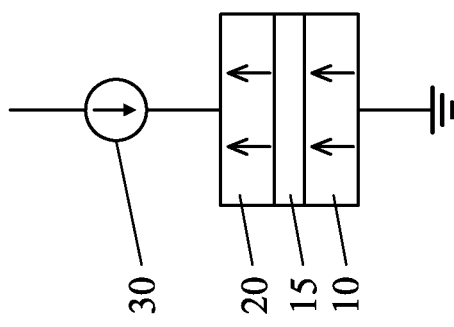
FIGS. 3A and 3B show operations of the MTJ film stack.
Figure 3D:
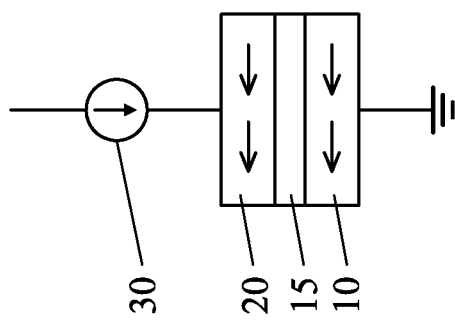
FIGS. 3C and 3D show operations of the MTJ film stack.
Figure 3A:
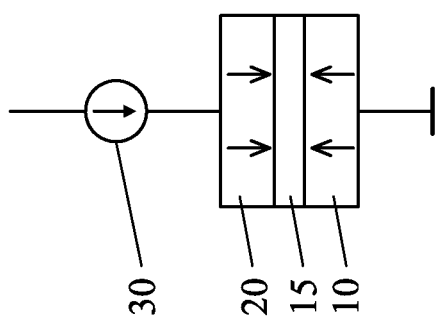
Figure 3C:
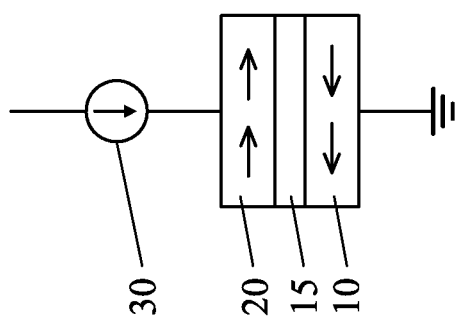

In FIG. 3A, the pinned magnetic layer 10 and the free magnetic layer 20 are magnetically oriented in opposite directions. In some embodiments, the spin directions of the pinned magnetic layer 10 and the free magnetic layer 20 are parallel to the film stack direction (perpendicular to the surface of the films). In FIG. 3B, the pinned magnetic layer 10 and the free magnetic layer 20 are magnetically oriented in the same direction. In other embodiments, the spin directions of the pinned magnetic layer 10 and the free magnetic layer 20 are perpendicular to the film stack direction (parallel with the surface of the films), as shown in FIGS. 3C and 3D. In FIG. 3C, the pinned magnetic layer 10 and the free magnetic layer 20 are magnetically oriented in opposite directions, while in FIG. 3D, the pinned magnetic layer 10 and the free magnetic layer 20 are magnetically oriented in the same direction.

If the same current value $I_C$ is forced to flow through the MTJ cell by the current source 30, it is found that the cell voltage $V_1$ in the case of FIG. 3A (or FIG. 3C) is larger than the cell voltage $V_2$ in the case of FIG. 3B (or FIG. 3D), because the resistance of an opposite-oriented MTJ cell shown in FIG. 3A (or FIG. 3C) is greater than the resistance of a same-oriented MTJ cell shown in FIG. 3B (or FIG. 3D). Binary logic data ("0" and "1") can be stored in a MTJ cell and retrieved based on the cell orientation and resulting resistance. Further, since the stored data does not require a storage energy source, the cell is non-volatile.

Figure 4A:
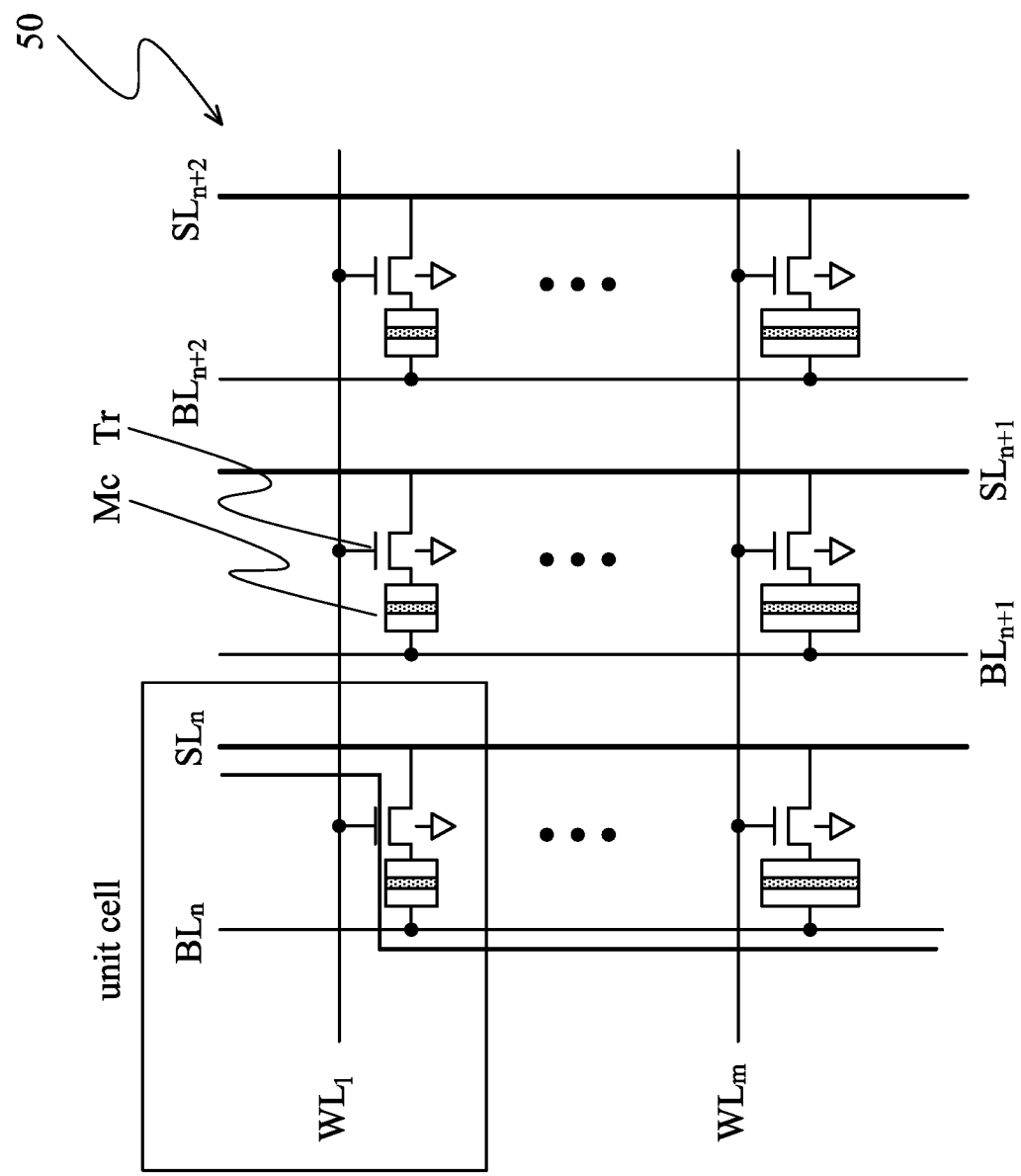
FIG. 4A shows a schematic circuit diagram of an MTJ MRAM.

FIG. 4A shows a schematic circuit diagram of an MTJ MRAM array 50. Each memory cell includes a MTJ cell Mc and a transistor Tr, such as a MOS FET. The gate of the transistor Tr is coupled to one of word lines $WL_1 \ldots WL_m$ and a drain (or a source) of the transistor Tr is coupled to one end of the MTJ cell Mc, and another end of the MTJ cell is coupled to one of bit lines $BL_n$, $BL_{n+1}$ and $BL_{n+2}$. Further, in some embodiments, signal lines (not shown) for programming are provided adjacent to the MTJ cells.

A memory cell is read by asserting the word line of that cell, forcing a reading current through the bit line of that cell, and then measuring the voltage on that bit line. For example, to read the state of a target MTJ cell, the word line is asserted to turn ON the transistor Tr. The free magnetic layer of the target MTJ cell is thereby coupled to one of the fixed potential lines $SL_n$, $SL_{n+1}$ and $SL_{n+2}$, e.g., the ground, through the transistor Tr. Next, the reading current is forced on the bit line. Since only the given reading transistor Tr is turned ON, the reading current flows through the target MTJ cell to the ground. The voltage of the bit line is then measured to determine the state ("0" or "1") of the target MTJ cell. In some embodiments, as shown in FIG. 4A, each MTJ cell has one reading transistor Tr. Therefore, this type of MRAM architecture is called 1T1R. In other embodiments, two transistors are assigned to one MTJ cell, forming a 2T1R system. Other cell array configurations can be employed.

Figure 4B:
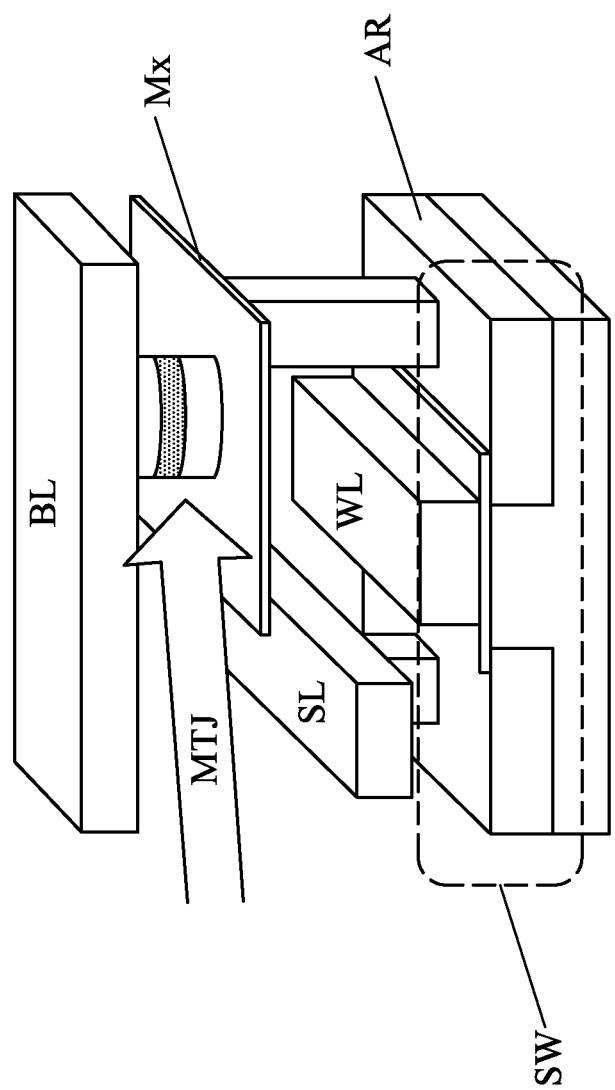
FIG. 4B shows a schematic perspective view of a memory cell of the MTJ MRAM and FIG. 4C shows a memory cell layout of the MTJ MRAM.
Figure 4C:
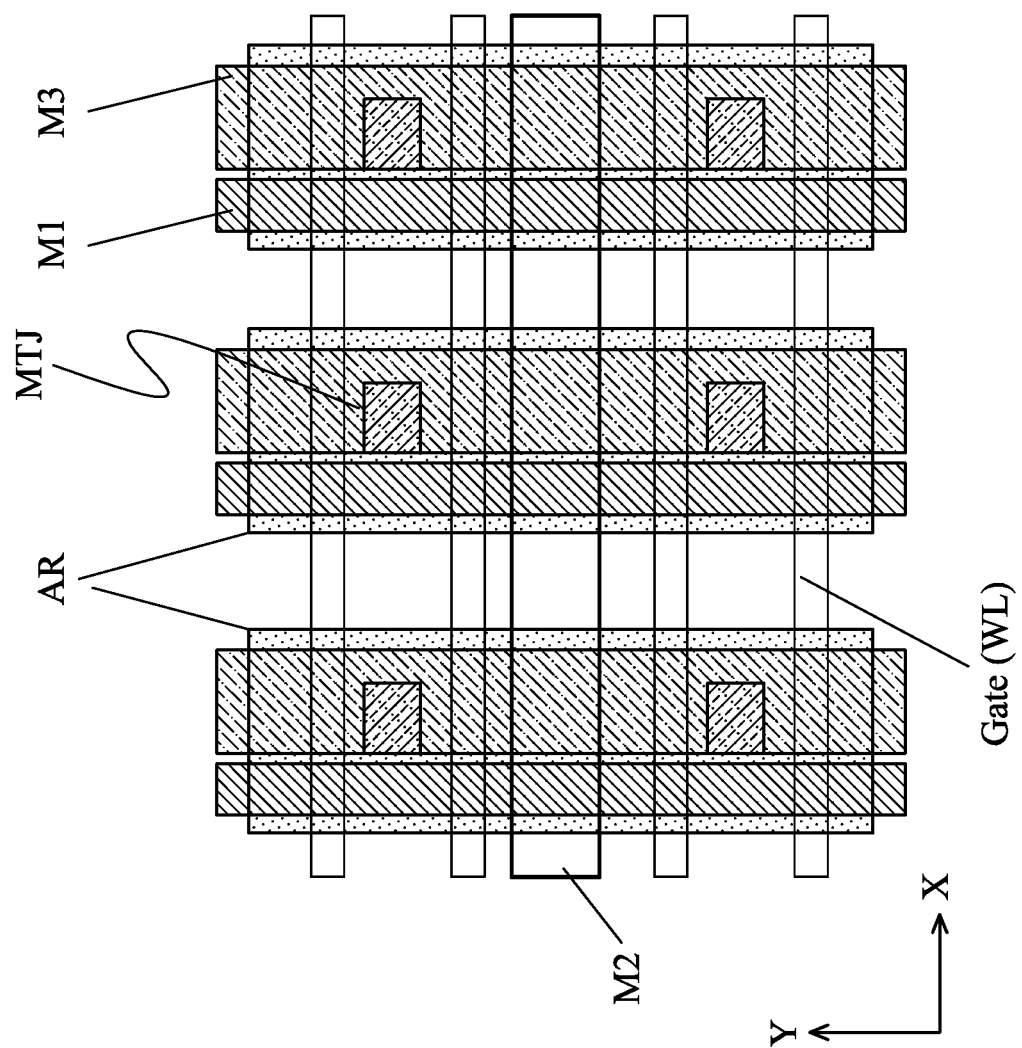

FIG. 4B shows a schematic perspective view of a memory cell of the MTJ MRAM and FIG. 4C shows a memory cell layout of the MTJ MRAM.

As shown in FIGS. 4B and 4C, the MTJ cell MTJ is disposed above a switching device SW, such as a MOS FET. The gate of the MOSFET is a word line WL or coupled to a word line formed by a metal layer. The bottom electrode Mx of the MTJ cell is coupled to a drain of the MOS FET formed in an active region AR and a source of the MOS FET formed in the active region AR is coupled to the source line SL. The upper electrode of the MTJ cell is coupled to a bit line BL. In some embodiments, the source line SL can be formed by metal layers M1 and M2, and the bit line BL can be formed by a metal layer M3. In certain embodiments, one of more metal wirings is a single device layer, and in other embodiments, one or more metal wirings are two or more device layers.

Figure 5A:
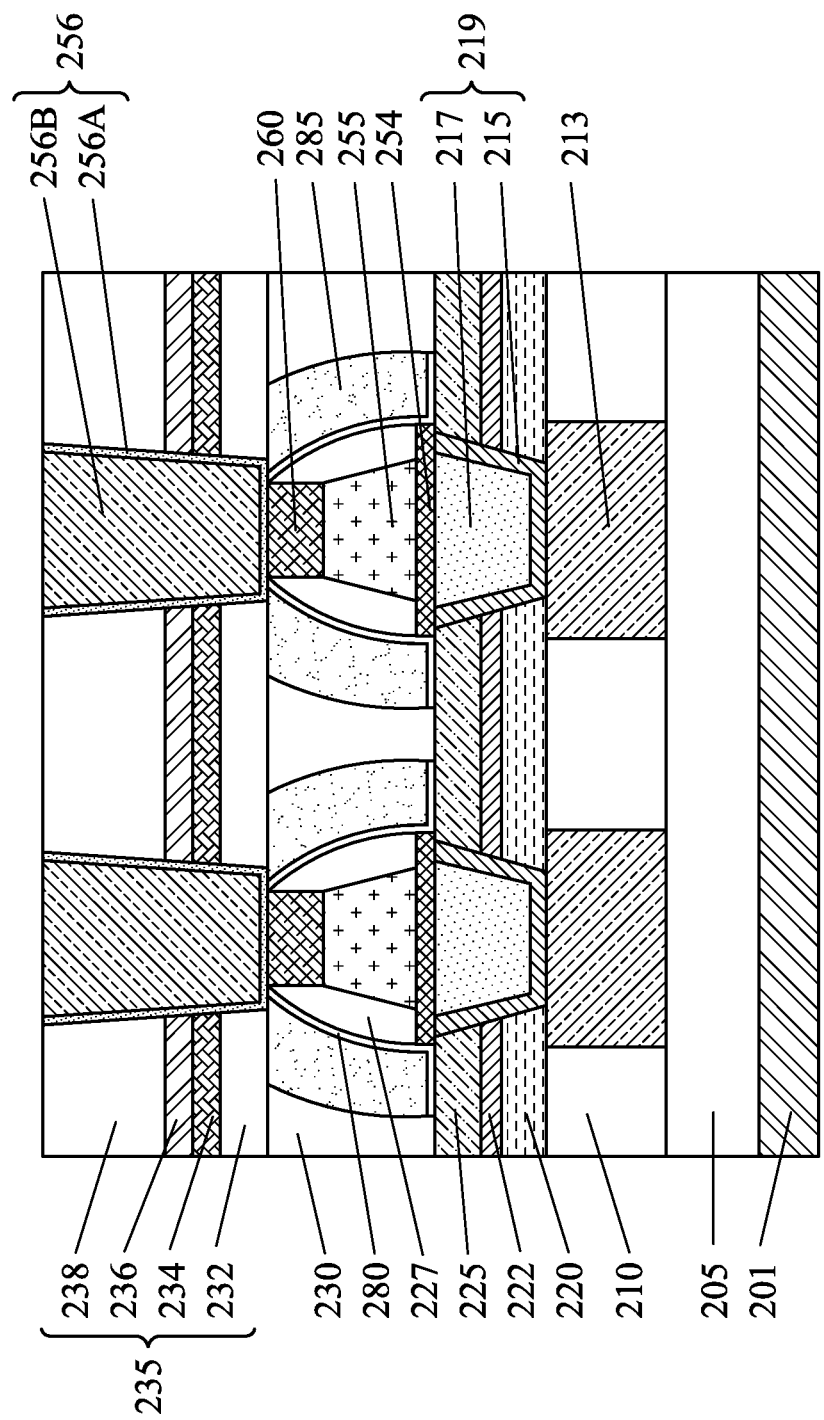
FIGS. 5A, 5B, 5C and 5D show cross sectional views of a semiconductor device including an MRAM according to embodiments of the present disclosure.

FIG. 5A shows a cross sectional views of a MTJ MRAM according to embodiments of the present disclosure. Material, configuration, dimensions and/or processes the same as or similar to the foregoing embodiments described in FIGS. 1A-4C may be employed in the following embodiments, and detailed explanation thereof may be omitted.

As shown in FIG. 5A, the MTJ cells of an MRAM are disposed over a substrate 201. In some embodiments, the substrate 201 includes a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 201 may include an epitaxial layer (epi-layer), which may be strained for performance enhancement, and/or may include a silicon-on-insulator (SOI) structure.

Various electronic devices (not shown), such as transistors (e.g., MOS FET), are disposed on the substrate 201. The MOS FET may include a planar MOS FET, a fin FET and/or a gate-all-around FET. A first interlayer dielectric (ILD) layer 210 is disposed over the substrate 201 to cover the electronic devices. In some embodiments, another ILD layer 205 is disposed between the first ILD layer and the substrate 201. The first ILD layer 210 may be referred to as an inter-metal dielectric (IMD) layer. The first ILD layer 210 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the first ILD layer 210 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Further, a lower metal wiring 213 is formed by, for example, a damascene process. The lower metal wiring 213 includes one or more layers of conductive material, such as Cu, a Cu alloy, Al or any other suitable conductive materials.

Each of the MTJ cells is disposed over the lower metal wiring 213, as shown in FIG. 5A. Although FIG. 5A shows two MTJ cells, the number of the MTJ cells is not limited to two. In some embodiments, the lower metal wirings 213 are formed at the N-th metal wiring layer, where N is an integer from any of 2 to 8.

As shown in FIG. 5A, a first insulating layer functioning as an etch stop layer 220 is formed on the first ILD layer 210. In some embodiments, the first insulating layer 220 includes a material different from the first ILD layer 210 and includes silicon carbide, silicon nitride, aluminum oxide or any other suitable material. The thickness of the first insulating layer 220 is in a range from about 10 nm to about 25 nm in some embodiments. In some embodiments, an additional insulating layer 222 functioning as an etch stop layer is formed on the first insulating layer 220 and includes silicon carbide, silicon nitride, aluminum oxide or any other suitable material, different from the first insulating layer 220.

A second ILD layer 225 is formed over the second insulating layer 222. The second ILD layer includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210 and the material for the second ILD layer 225 are the same. In other embodiments, different dielectric materials are used for the first ILD layer 210 and the second ILD layer 225.

A via contact 219 is formed in contact with the lower metal wiring 213 and passing through the second ILD layer 225 and the first and second insulating layers 220, 222 in some embodiments. In some embodiments, the via contact 219 includes a liner or barrier layer 215 and a body layer 217. The liner layer 215 includes one or more layers of Ti, TiN, Ta or TaN, or other suitable material, and the body layer 217 includes one or more layers of W, Cu, Al, Mo, Co, Pt, Ni, and/or an alloy thereof or other suitable material, in some embodiments.

An MRAM cell includes a bottom electrode 254, an MTJ film stack 255 and a top electrode 260, as shown in FIG. 5A. The bottom electrode 254 and the MTJ film stack 255 correspond to the first electrode 110 and the MTJ film stack 101 of FIG. 1B. In some embodiments, the top electrode 260 corresponds to the second electrode 155 of FIG. 1B or the wiring layer My of FIG. 1A. In some embodiments, the top electrode 260 includes one or more of Ti, TiN, Ta or TaN. In some embodiments, the width of the bottom electrode 254 is smaller than the largest width of the via contact 219.

The MRAM cell structure has a tapered shape in some embodiments, as shown in FIG. 5A. The width of the MRAM cell structure at the bottom (the bottom electrode 254) is greater than the width at the top. The thickness of the bottom electrode 254 is in a range from about 5 nm to about 20 nm in some embodiments. The thickness of the MTJ film stack 255 is in a range from about 15 nm to about 50 nm in some embodiments. In some embodiments, the width of the bottom electrode 254 is greater than the largest width of the MTJ film stack 255. The difference in the width between the bottom electrode and the largest width of the MTJ film tack 255 is in a range from about 1 nm to about 5 nm depending on the design and/or process requirement.

In some embodiments, a first insulating cover layer 227 as a sidewall spacer layer is formed on opposing side walls of the MRAM cell structure. The first insulating cover layer 227 includes one or more layers of insulating material. In some embodiments, a nitride-based insulating material is used. In certain embodiments, the nitride-based insulating material is a silicon nitride-based insulating material, such as silicon nitride, SiON, SiCN and SiOCN. The thickness T1 of the first insulating cover layer 227 (a horizontal largest width) is in a range from about 5 nm to about 30 nm in some embodiments, and is in a range from about 10 nm to about 20 nm in other embodiments. As shown in FIG. 5A, the first insulating cover layer 227 lands on the bottom electrode 254 and is separated from the second ILD layer 225 and/or the via contact 219 by the bottom electrode 254.

Further, a second insulating cover layer (sidewall spacer) 280 is formed over the first insulating cover layer 227 in some embodiments. The second insulating cover layer 280 includes one or more layers of insulating material different from the first insulating cover layer 227. In some embodiments, an aluminum-based insulating material is used. In certain embodiments, the aluminum-based insulating material includes aluminum oxide, aluminum nitride, aluminum oxynitride, aluminum carbide and/or aluminum oxycarbide. In some embodiments, the concentrations of Al, O, C and/or N in the thickness direction are not uniform. In certain embodiments, the concentration of Al gradually decreases from the bottom to the top of the second insulating cover layer 280, while the concentrations of O, C and/or N gradually increase from the bottom to the top of the second insulating cover layer 280. The thickness T2 of the second insulating cover layer 280 is smaller than the thickness T1 of the first insulating cover layer (a horizontal largest width) in some embodiments. The thickness T2 is in a range from about 1 nm to about 10 nm in some embodiments, and is in a range from about 3 nm to about 5 nm in other embodiments. As shown in FIG. 5A, the second insulating cover layer 280 covers the sidewalls of the bottom electrode 254 and is in contact with the second ILD layer 225. The length of the lateral part of the second insulating cover layer 280 on the second ILD layer 225 is in a range from about 1 nm to about 10 nm depending on the design and/or process requirements.

Moreover, a third insulating cover layer (sidewall spacer) 285 is formed over the second insulating cover layer 280. In some embodiments, the third insulating cover layer 285 includes an oxide-based insulating material. In certain embodiments, the oxide-based insulating material is a silicon oxide-based insulating material, such as silicon oxide, SiON, SiOC and SiOCN. In some embodiments, the third insulating cover layer 285 lands on the second insulating cover layer 280 and is separated from the second ILD layer 225 and/or the via contact 219 by the bottom electrode 254.

Further, a third ILD layer 230 is disposed in spaces between the MRAM cell structures. The third ILD layer 230 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210, the material for the second ILD layer 225 and the material for the third ILD layer 230 are the same. In other embodiments, at least two of them are made of different dielectric materials.

Further, a fourth ILD layer 235 is disposed over the third ILD layer 230. In some embodiments, the fourth ILD 235 layer is a multiple layer structure and includes a first dielectric layer 232 as an etch stop layer formed on the third ILD layer 230, a second dielectric layer 234 formed on the first dielectric layer 232, a third dielectric layer 236 formed on the second dielectric layer 234 and a fourth dielectric layer 238 formed on the third dielectric layer 236. In other embodiments, the fourth ILD layer is a two or three-layer structure without one or more of the first, second or third dielectric layers.

In some embodiments, the first dielectric layer 232, the second dielectric layer 234 and the fourth dielectric layer 238 are made of different material than the third dielectric layer 236 and include one or more layers of silicon oxide, silicon nitride, SiON, SiOCN, SiCN, SiC or any other suitable material. In some embodiments, the first dielectric layer 232 and second dielectric layer 234 are made of different materials from each other.

One or more of the first dielectric layer 232, the second dielectric layer 234 and the fourth dielectric layer 238 include a fluorine-doped silicate glass (FSG), low-k dielectrics such as carbon doped oxides, extremely low-k dielectrics such as porous carbon doped silicon dioxide, a polymer such as polyimide, combinations of these, or the like.

In some embodiments, the third dielectric layer 236 includes an aluminum-based insulating material, such as, aluminum oxide, aluminum nitride, aluminum oxynitride, aluminum carbide and/or aluminum oxycarbide. In other embodiments, the third dielectric layer includes a Zr or Zn based insulating material (Zr oxide, Zn oxide).

In some embodiments, the material for the first ILD layer 210, the material for the second ILD layer 225, the material for the third ILD layer 230 and the material for the third dielectric layer 236 are the same. In other embodiments, at least two of them are made of different dielectric materials. The thickness of the fourth dielectric layer 238 is greater than the thicknesses of the first, second and third dielectric layers in some embodiments.

In some embodiments, an upper electrode 256 passes through the fourth ILD layer 235 and is formed over the top electrode 260. The upper electrode 256 is made of, for example, Cu, Al, Ta, Ti, Mo, Co, Pt, Ni, W, TiN and/or TaN and/or an alloy thereof or other suitable material. In some embodiments, the upper electrode 256 includes one or more liner or barrier layer 256A and a body metal layer 256B. In some embodiments, the liner or barrier layer 256A is made of Ta, TaN and/or Co, and the body metal layer 256B is made of Cu or a Cu alloy (e.g., AlCu).

Figure 5B:
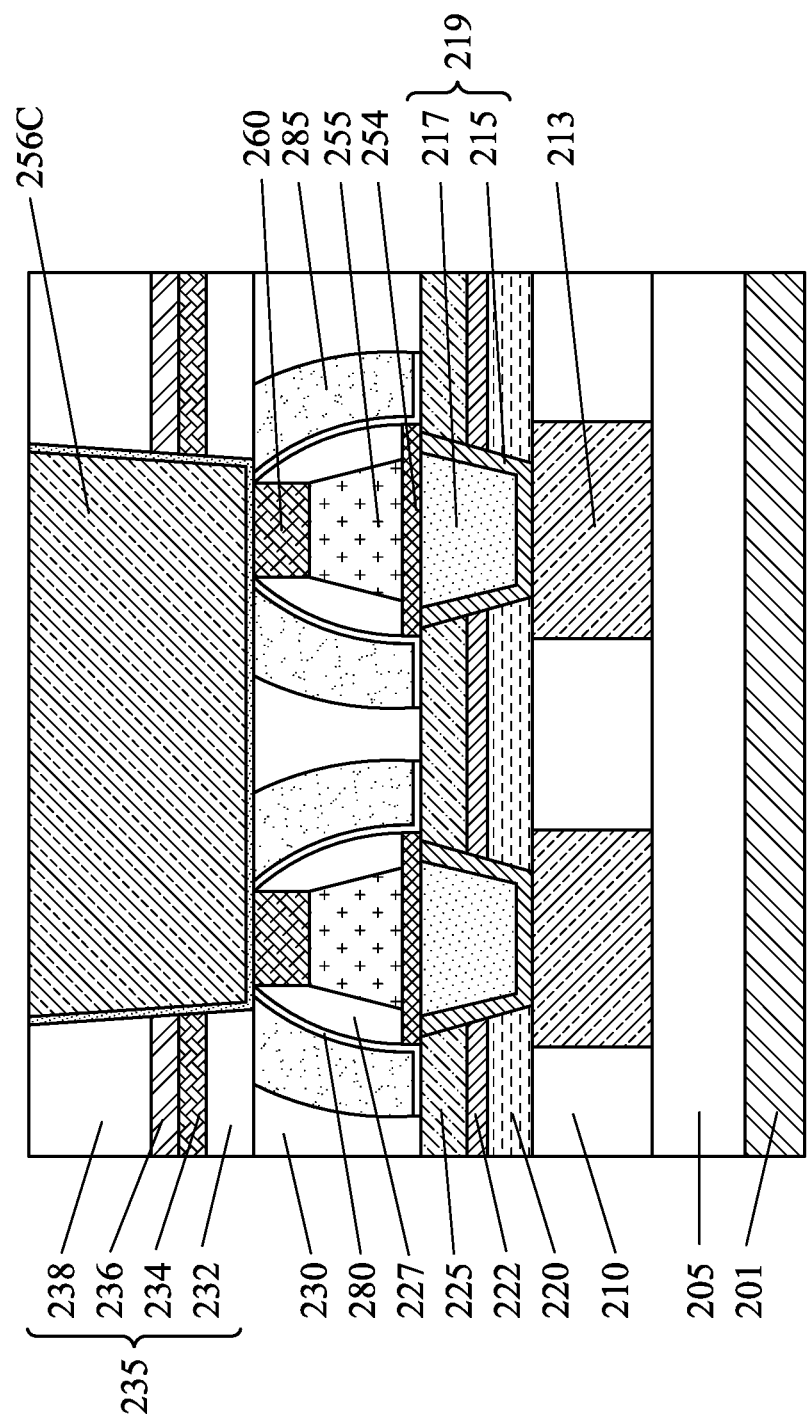

FIG. 5B shows a cross sectional views of a MTJ MRAM according to embodiments of the present disclosure. Material, configuration, dimensions and/or processes the same as or similar to the foregoing embodiments described with FIGS. 1A-5A may be employed in the following embodiments, and detailed explanation thereof may be omitted.

In some embodiments, the upper electrode 256C is commonly formed over two or more MRAM cell structures. The materials and/or structures of the upper electrode 256C are the same as those of the upper electrode 256 of FIG. 5A. In some embodiments, the common contact 256C functions as a bit line.

Figure 5C:
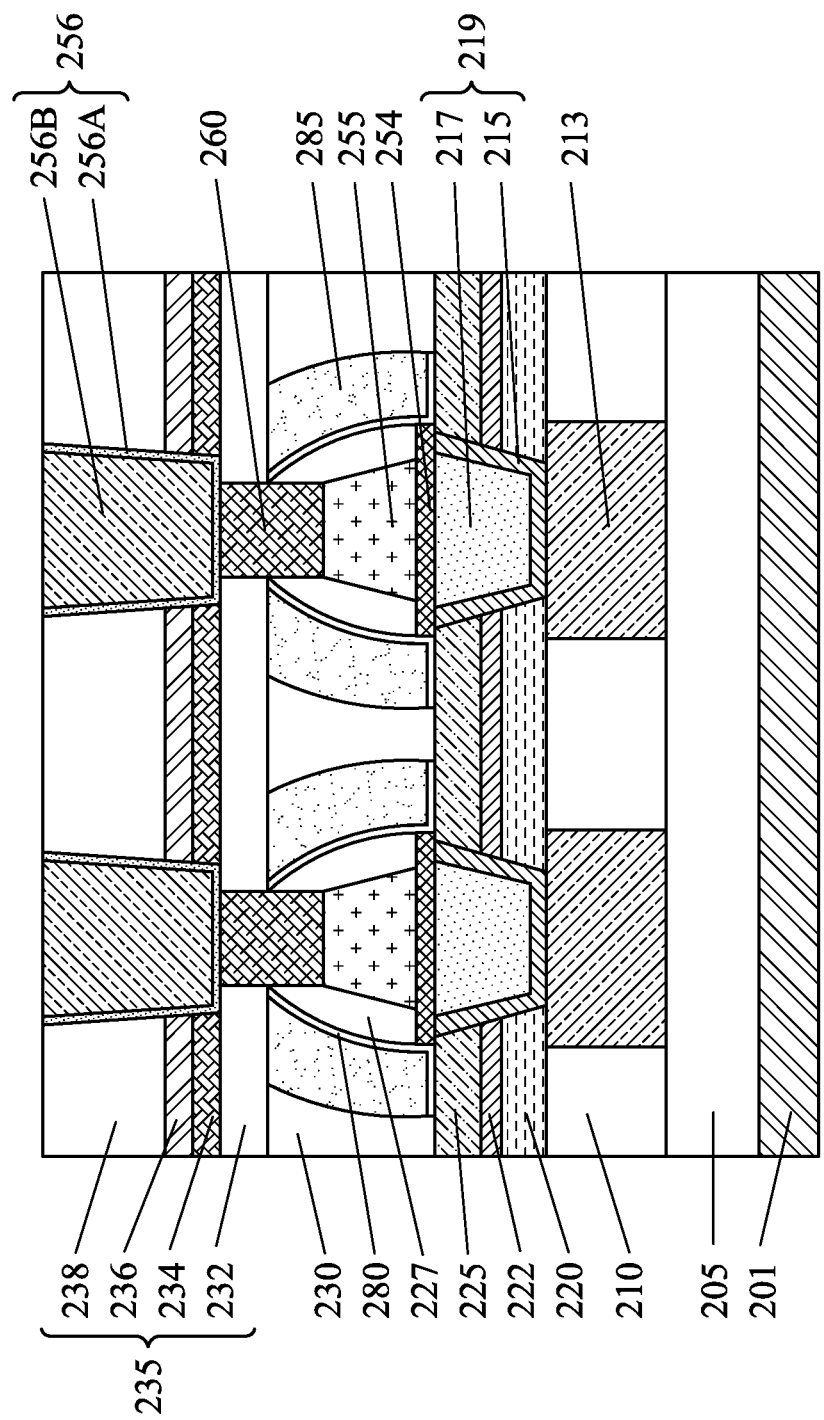
Figure 5D:
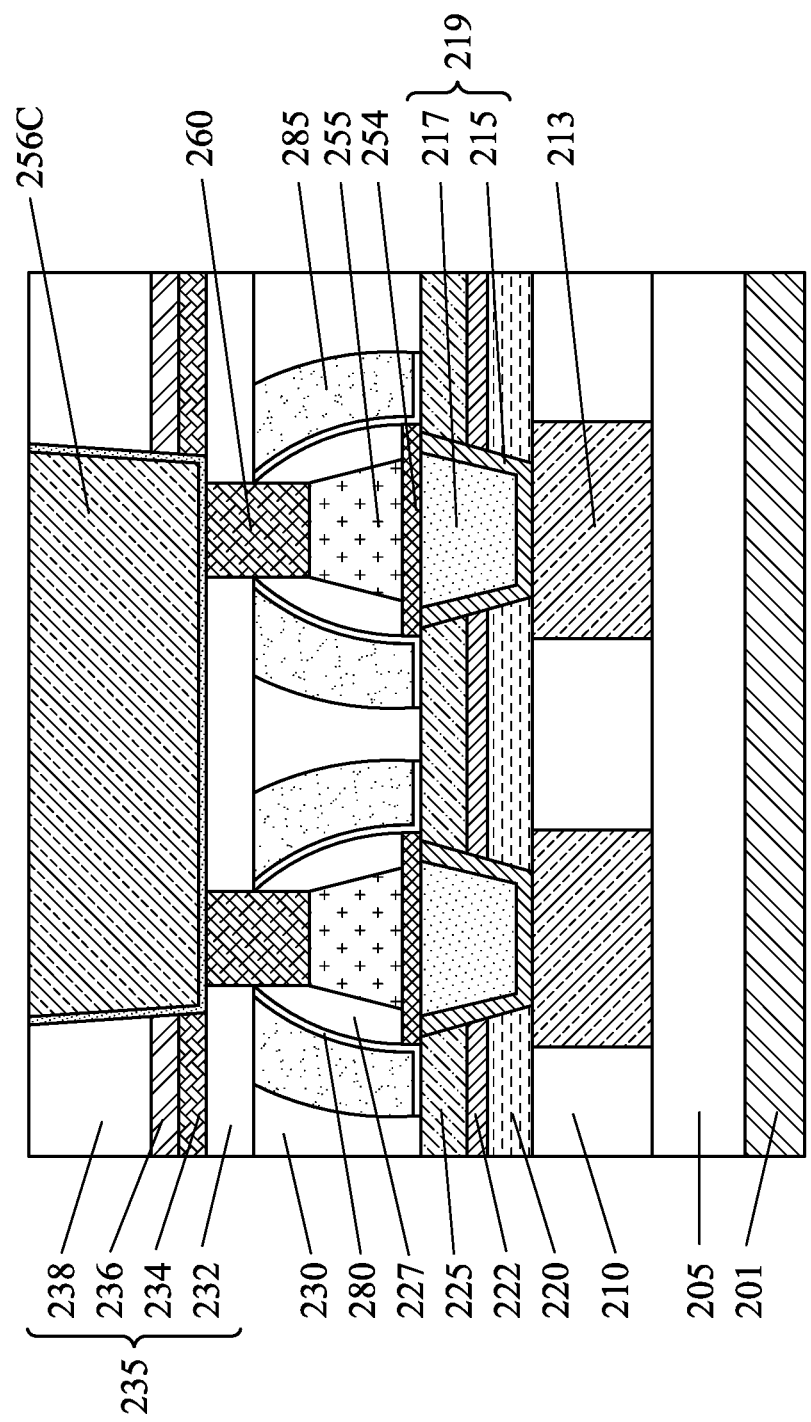

FIGS. 5C and 5D show cross sectional views of a MTJ MRAM according to embodiments of the present disclosure. Material, configuration, dimensions and/or processes the same as or similar to the foregoing embodiments described with FIGS. 1A-5B may be employed in the following embodiments, and detailed explanation thereof may be omitted.

In some embodiments, the upper electrode 260 protrudes into one or more layers of the fourth ILD layer 235 and is in contact with the upper electrode 256.

FIGS. 6A-17 show various stages of a sequential manufacturing process of the semiconductor device including an MRAM according to an embodiment of the present disclosure. It is understood that additional operations can be provided before, during, and after processes shown by FIGS. 6A-17, and some of the operations described below can be replaced or eliminated, for additional embodiments of the method. Material, configuration, dimensions and/or processes the same as or similar to the foregoing embodiments described with FIGS. 1A-5B may be employed in the following embodiments, and detailed explanation thereof may be omitted.

Figure 6A:
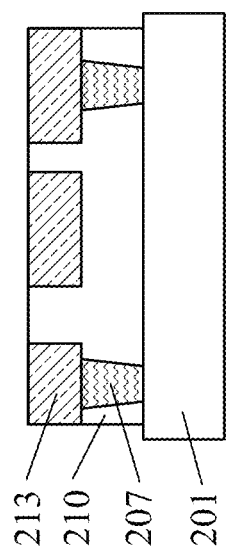
FIGS. 6A, 6B and 6C show various stages of a sequential manufacturing process of a semiconductor device including an MRAM according to an embodiment of the present disclosure.

As shown in FIG. 6A, lower metal wirings 213 are formed in the first ILD layer 210 over the substrate 201. In some embodiments, via contacts 207 are provided under the lower metal wirings 213. Then, as shown in FIG. 6B, a first insulating layer as an etch stop layer 220 is formed over the structure of FIG. 6A, and a second ILD layer 225 is formed over the first insulating layer 220.

Figure 6B:
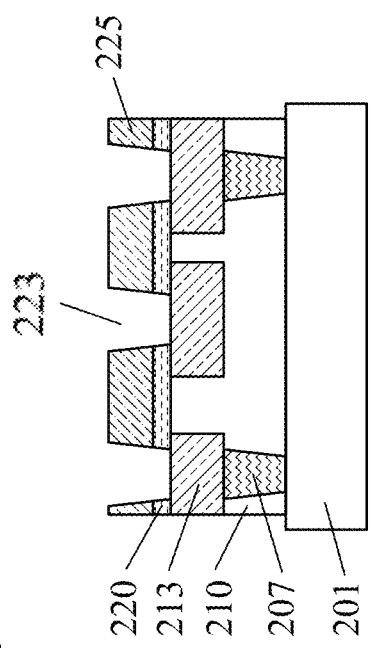

Further, as shown in FIG. 6B, via contact openings 223 are formed to expose the upper surface of the lower metal wirings 213, by using one or more lithography and etching operations.

Figure 6C:
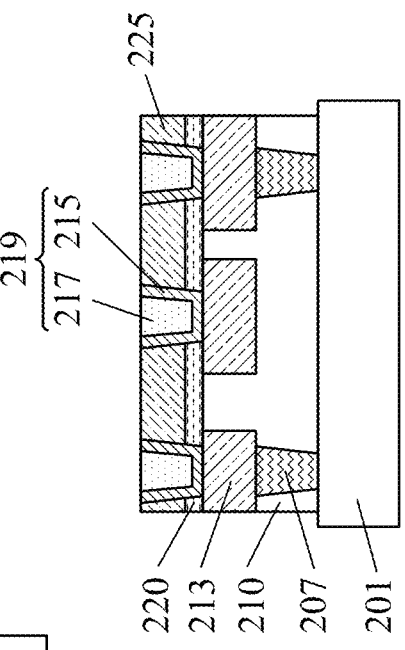

Subsequently, via contact 219 including layers 215 and 217 are formed, as shown in FIG. 6C. One or more film forming operations, such as CVD, PVD including sputtering, ALD, electro-chemical plating and/or electro-plating, are performed, and a planarization operation, such as CMP, is performed to fabricate the via contacts 219.

In FIGS. 7-13, a MRAM area and a logic circuit area are illustrated. The logic circuit area includes driver circuits, logic function circuit and any other semiconductor circuitry.

Figure 7:
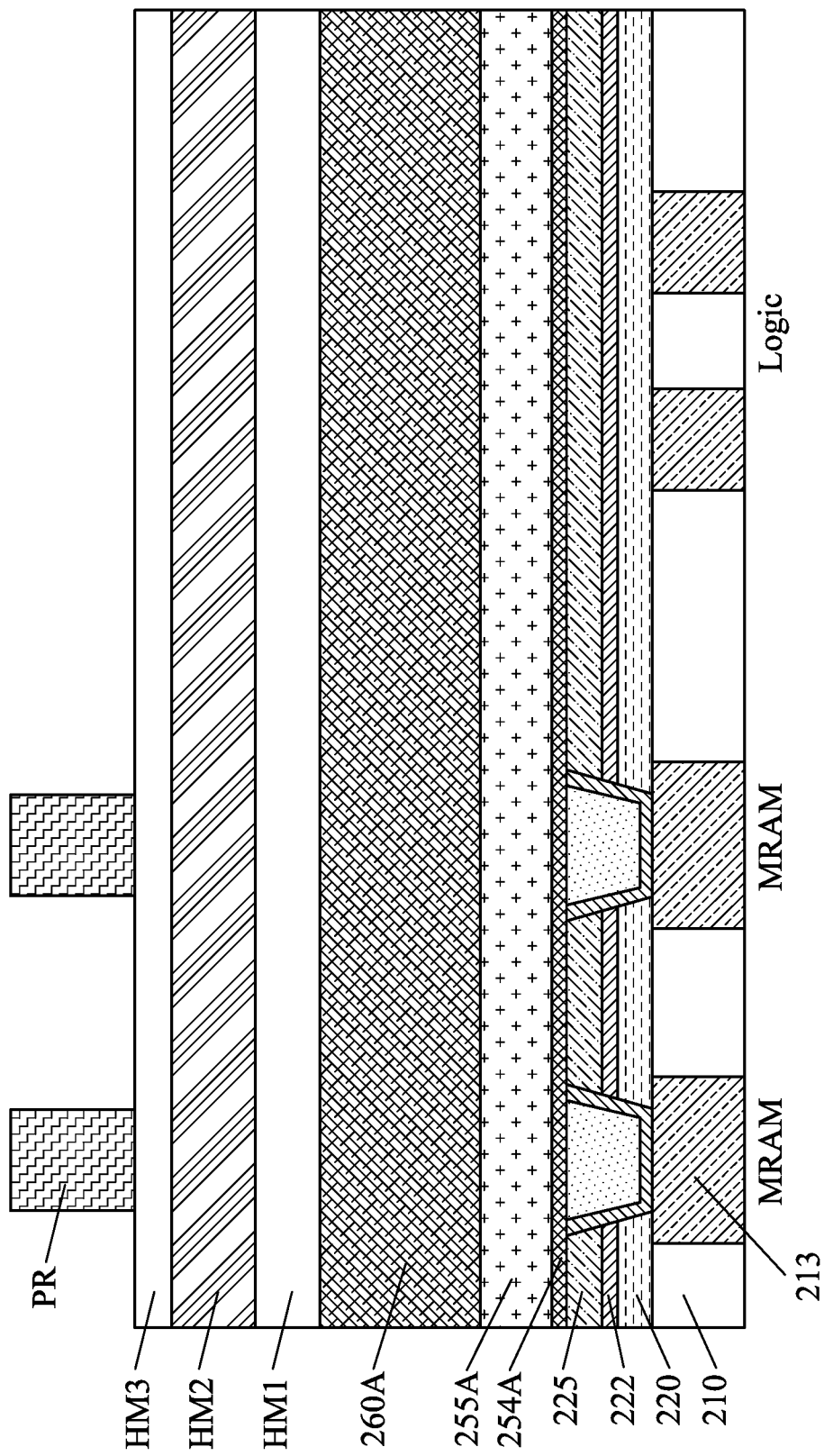
FIGS. 7, 8, 9, 10, 11, 12, 13, 14, 15, 16, and 17 show various stages of a sequential manufacturing process of a semiconductor device including an MRAM according to an embodiment of the present disclosure.

As shown in FIG. 7, a first conductive layer 254A for the bottom electrode 254 is formed over the structure shown in FIG. 6C and subsequently, a stacked layer 255A for the MTJ film stack 255 and a second conductive layer 260A for a hard mask layer are sequentially formed over the first conductive layer 254A. In some embodiments, the hard mask layer 260A includes one or more of Ti, TiN, Ta or TaN. In certain embodiments, the hard mask layer 260A includes TiN with a thickness in a range from about 30 nm to about 100 nm. In some embodiments, the thickness of the first conductive layer 254A is in a range from about 1 nm to about 5 nm.

Further, one or more hard mask layers HM1, HM2 and HM3 are formed over the second conductive layer 260A. In some embodiments the first hard mask layer HM1 includes TEOS or silicon oxide having a thickness of about 20 nm to about 35 nm. In some embodiments, the second and third hard mask layer HM2 and HM3 includes amorphous carbon, amorphous silicon, polysilicon, silicon nitride, SiON, SiOCN, SiOC, SiCN, SiC, aluminum oxide, aluminum nitride, hafnium oxide, zinc oxide, zirconium oxide, titanium oxide, or any other suitable material. In some embodiments, the second hard mask layer HM2 includes amorphous carbon having a thickness of about 25 nm to about 40 nm. In some embodiments, the third hard mask layer HM3 includes amorphous silicon having a thickness of about 8 nm to about 20 nm. Further, a photo resist pattern PR is formed on the third hard mask layer HM3.

Figure 8:
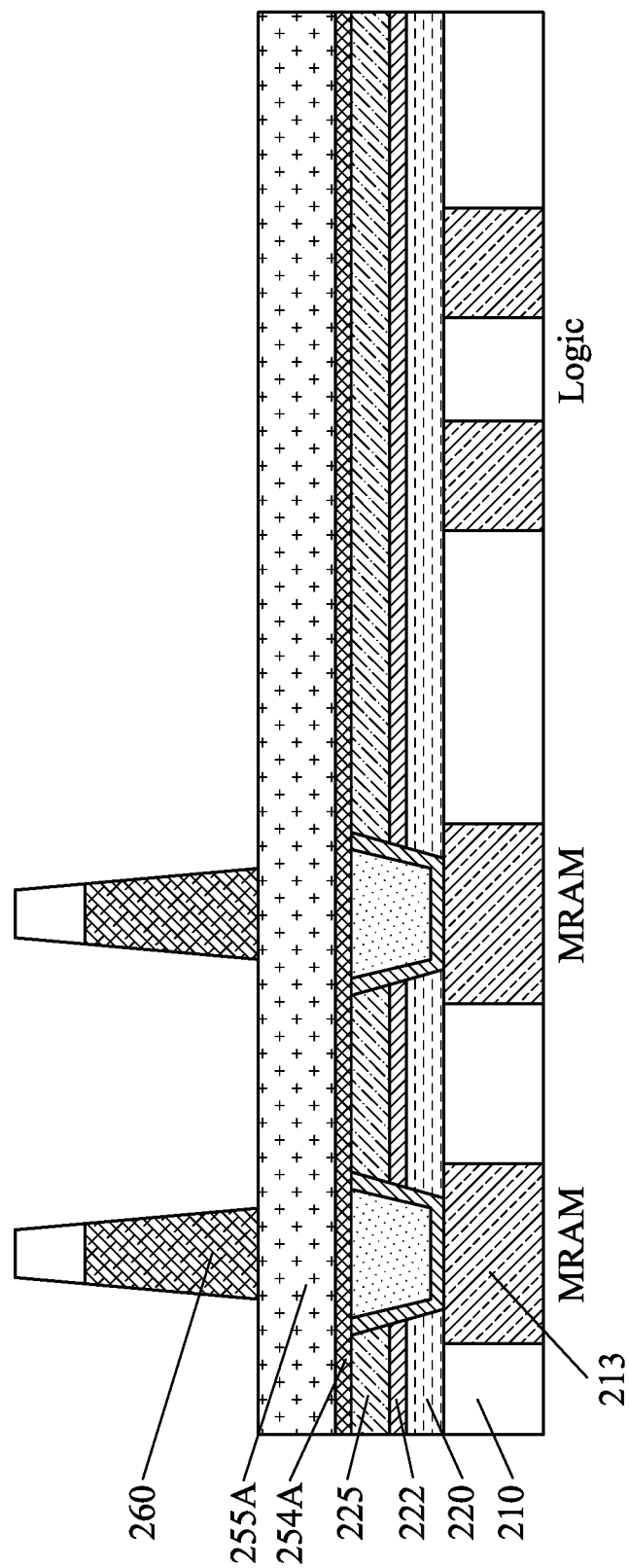
Figure 9:
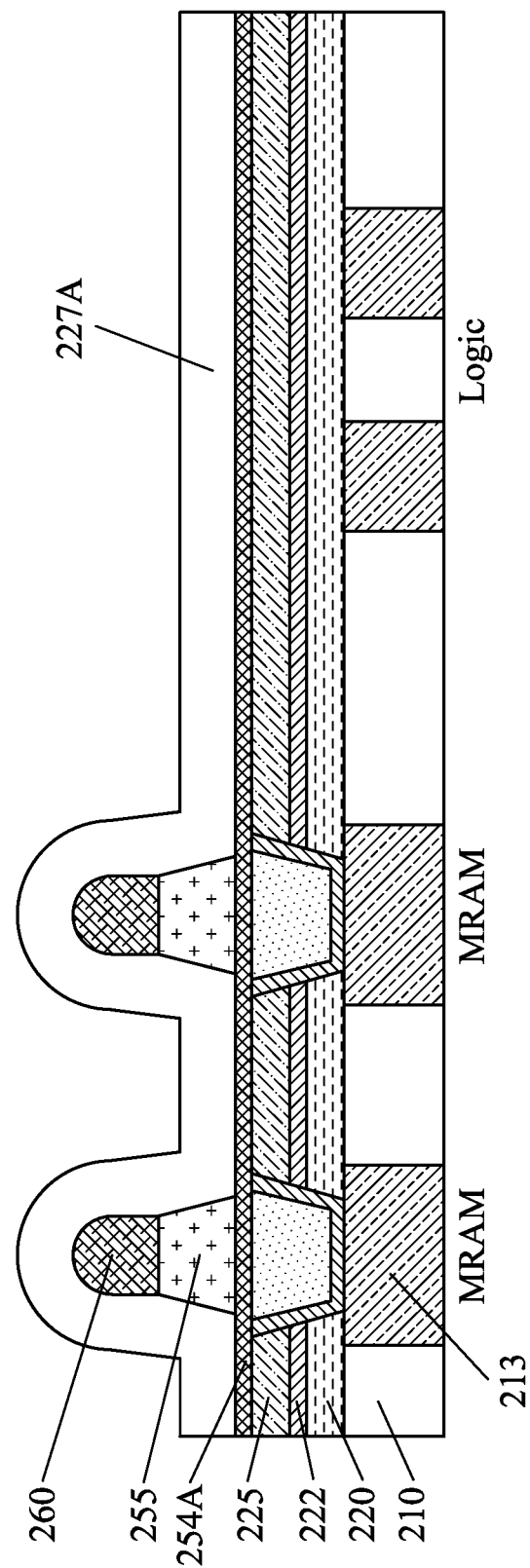

By using one or more etching operations, the hard mask layer 260A is patterned into the hard mask pattern 260 as shown in FIG. 8. Then, by using the hard mask pattern 260 as an etching mask, the stacked layer 255A and the first conductive layer 254A are patterned into MRAM cell structures each including the bottom electrode 254, the MTJ film stack 255 and the hard mask pattern 260. As shown in FIG. 9, the etching of the MTJ film stack layer 255A stops at the first conductive layer 254A at both the memory cell region and the logic circuit region. In some embodiments, the etching of the MTJ film stack includes reactive ion etching (RIE) or ion beam etching (IBE) or the combination thereof. In some embodiments, IBE is first applied to etch the MTJ film stack and then the etching is switched to RIE, which has a higher etching selectivity between the MTJ film stack and the first conductive layer 254A (e.g., TiN) than the IBE. In some embodiments, only RIE is used. By using RIE, it is possible to suppress shadowing effects caused by a high aspect ratio of adjacent cell structures, compared with IBE. Moreover, the present embodiments can suppress the loading effect during the etching between the memory cell region (high pattern density) and the logic circuit region (low pattern density).

Subsequently, as shown in FIG. 9, an insulating layer 227A for a first insulating cover layer (sidewall) 227 is formed to cover the MRAM cell structures and over the first conductive layer 245A. The insulating layer 227A can be formed by CVD, PVD or ALD or any other suitable film deposition method. In some embodiments, the insulating layer 227A is formed by CVD, PVD or ALD at a temperature range less than about 150° C., such as a range from about 100° C. to about 150° C. When the insulating layer 227A is formed at a higher temperature, such as a range from about 200° C. to about 300° C. (or more), the film formation process may cause damage to the MTJ film stack 255 since the insulating layer is directly formed on the MTJ film stack 255. As shown in FIG. 9, the insulating layer 227A is conformally formed over the MRAM cell structures in some embodiments.

Figure 10:
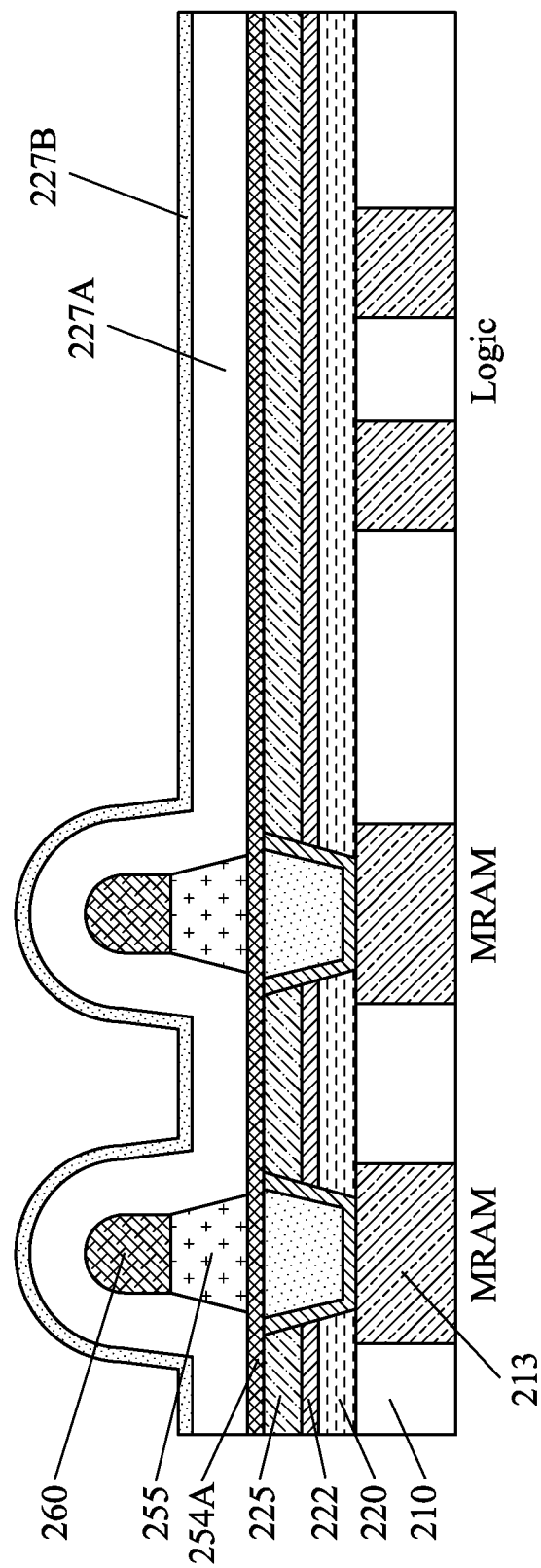

In some embodiments, an additional insulating layer 227B is formed over the insulating layer 227A as shown in FIG. 10. In some embodiments, the additional insulating layer 227B includes silicon oxide, SiON, SiOC or SiOCN. The thickness of the additional insulating layer 227B is in a range from about 2 nm to about 10 nm in some embodiments.

Figure 11:
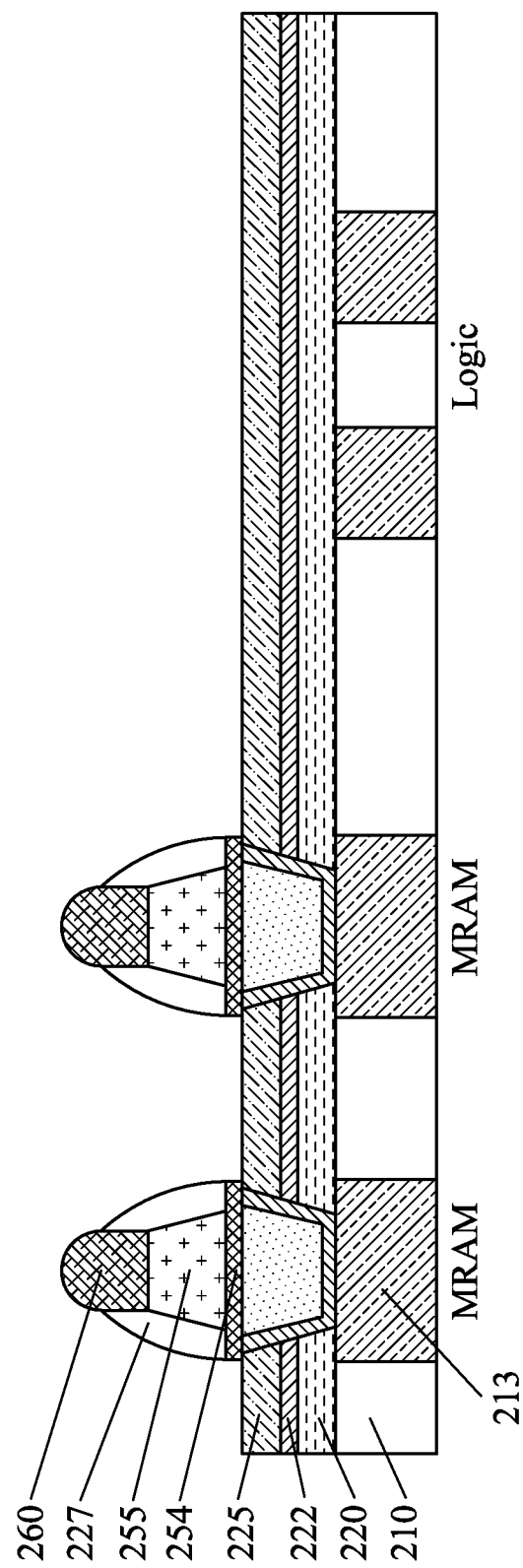

Then, one or more etching operations are performed to partially remove the insulating layer 227A to form a first insulating cover layer 227 as sidewall spacers, as shown in FIG. 11. In some embodiments, anisotropic plasma dry etching is employed. As shown in FIG. 11, the etching also removes the first conductive layer 254A and stops on the upper surface of the second ILD layer 225 at both the memory cell region and the logic circuit region. Thus, the bottom electrode 254 is formed. As shown in FIG. 11, a part of the bottom electrode 254 is disposed under the sidewall spacer 227.

In some embodiments, during the etching of the first conductive layer 254A, byproducts of the etching (the material of the first conductive layer) are re-deposited over the first insulating cover layer 227. Since the first insulating cover layer 227 is made of dielectric material while the re-deposited byproducts are conductive, it is possible to selectively remove the byproducts with a high selectivity. In some embodiments, the byproducts are removed by a cleaning operation using wet etching.

Figure 12:
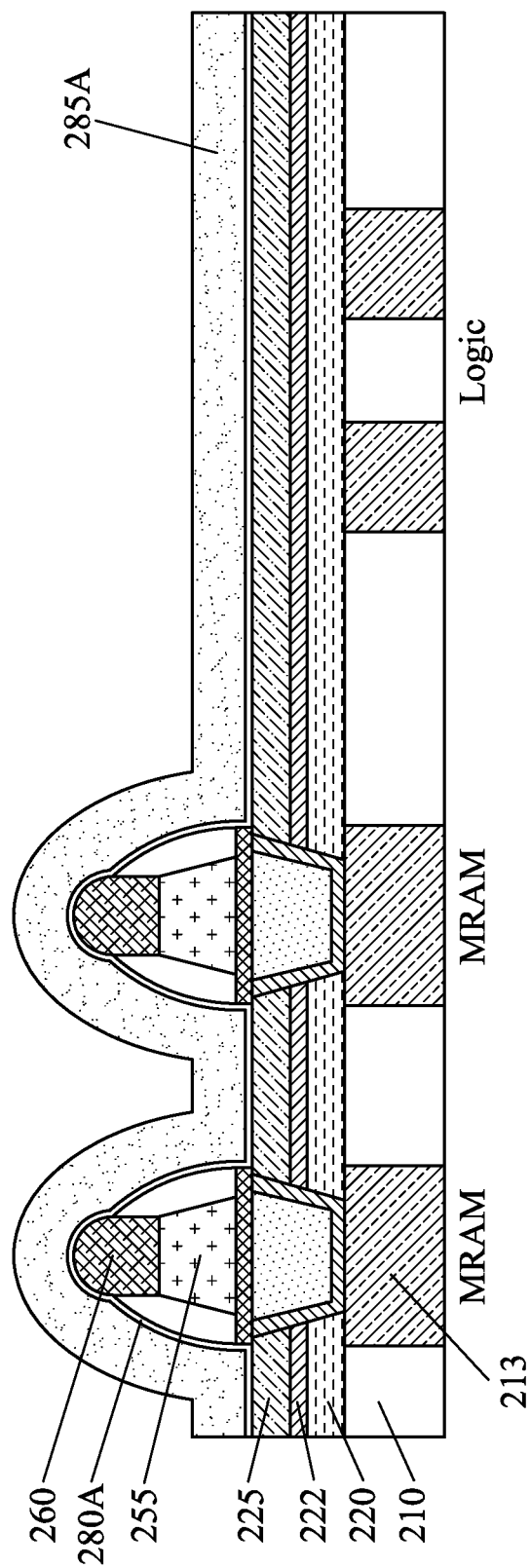

Then, as shown in FIG. 12, an insulating layer 280A for a second insulating cover layer 280 is formed to cover the MRAM cell structure. The insulating layer 280A can be formed by CVD, PVD or ALD or any other suitable film deposition method. As shown in FIG. 12, the insulating layer 280A is conformally formed. As set forth above, the insulating layer 280A for the second insulating cover layer 280 includes an aluminum-based insulating material in some embodiments. The aluminum-based insulating material, such as AlO ($Al_2O_3$), AlN, AlC, AlOC and AlON, can be formed by the following operations. First, an aluminum layer is formed by, for example, metal-organic CVD (MOCVD) or ALD using tri-methyl-aluminum (TMA). Then, a plasma treatment using $NH_3$, $CO_2$ and/or CO gases is performed over the aluminum layer, to convert the aluminum layer into AlO, AlN, AlC, AlOC or AlON. The concentrations of Al, O, C and/or N in the plasma treated aluminum layer are not uniform, in particular, along the vertical direction. The AlON layer may be made of two layers of AlO and AlN. In some embodiments, a thin layer of aluminum having a thickness of less than about 1 nm remains at the bottom of the layer. A chemical oxidation of the aluminum layer using an oxidation solution may be employed. In some embodiments, the AlO, AlOC, AlC, AlN and/or AlON layer can be directly formed by CVD, PVD or ALD or other suitable method by using appropriate source gases. In some embodiments, the insulating layer 280A is formed by CVD, PVD or ALD at a temperature in a range from about 300° C. to about 450° C. Although lower forming temperature (e.g., less than 300° C.) may be employed, since the first insulating cover layer 227 is formed to cover the MTJ film stack 255, a higher forming temperature (about 300° C. to about 450° C.) may not damage the MTJ film stack 255.

Next, as shown in FIG. 12, a dielectric material layer 285A is formed to fully cover the insulating layer 280A. In some embodiments, the dielectric layer 285A includes silicon oxide and is formed by CVD, PVD or ALD.

Figure 13:
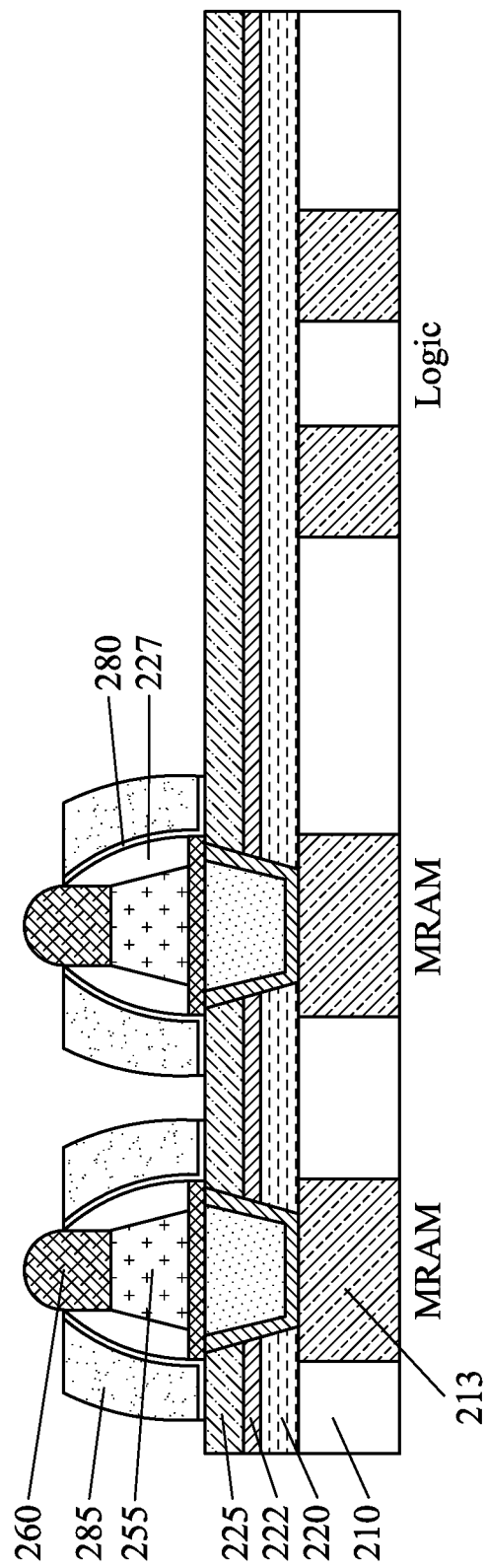

Subsequently, one or more planarization operations, such as a CMP operation or an etch-back operation, are performed to reduce the height of the dielectric material layer 285A, and further, an etch-back operation is performed on the dielectric material layer 285A and the insulating layer 280A to expose the hard mask pattern 260 and to form the second insulating cover layer 280 and the third insulating cover layer 285, as shown in FIG. 13. As shown in FIG. 13, the etching stops on the upper surface of the second ILD layer 225, and the top and a part of the side faces of the hard mask pattern 260 are exposed. In some embodiments, the dielectric material layer 285A and the insulating layer 280A are fully removed between adjacent memory cell structures, and at the logic circuit region as shown in FIG. 13.

Figure 14:
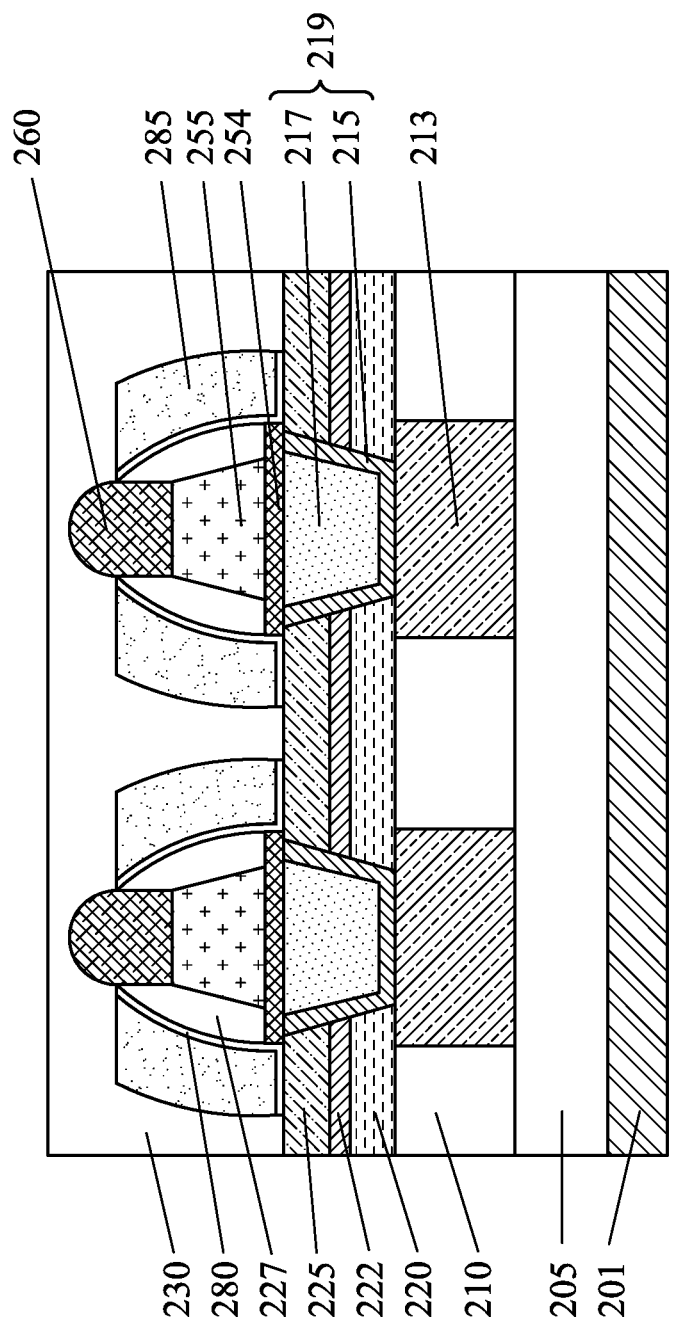

Then, a dielectric layer for the third ILD layer 230 is formed as shown in FIG. 14. In some embodiments, the third ILD layer 230 includes one or more dielectric layers and is also formed at the logic circuit region. In some embodiments, the third ILD layer 230 includes a low-k and/or an extreme low-k dielectric material. One or more planarization operations are performed during and/or after the formation of the third ILD layer 230.

Figure 15:
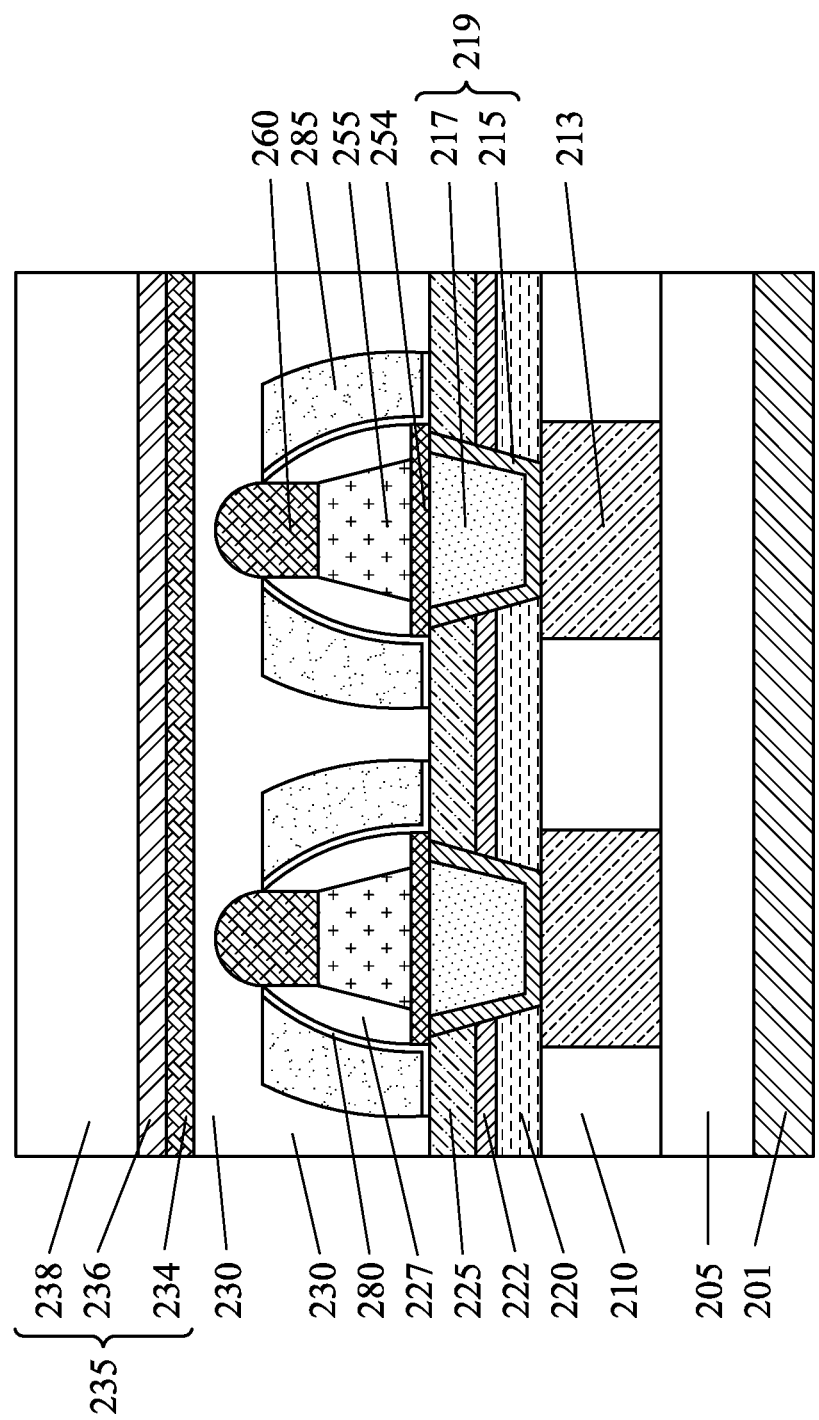

Then, a fourth ILD layer 235 is formed over the third ILD layer 230, as shown in FIG. 15. The dielectric layers of the fourth ILD layer can be formed by CVD, PVD or ALD or other suitable film formation method. In some embodiments, the fourth dielectric layer 238 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Figure 16:
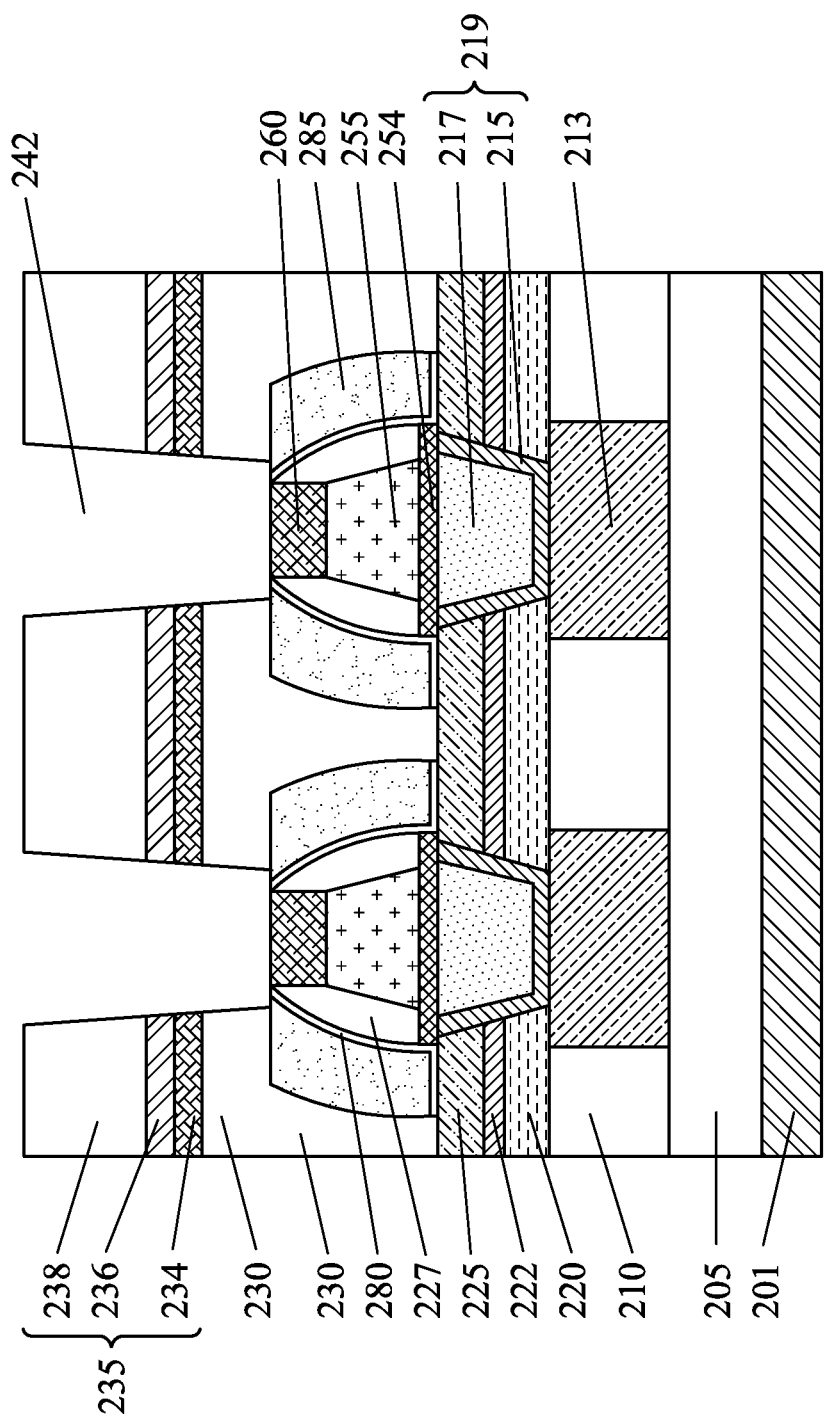

Then, as shown in FIG. 16, contact openings 242 are formed by using one or more lithography and etching operations. In some embodiments, the etching operation removes a part of the hard mask pattern 260. In some embodiments, the hard mask pattern 260 remains at the bottom of the contact opening 242 as shown in FIG. 16. In other embodiments, the hard mask pattern 260 is fully removed and the upper surface (the uppermost layer) of the MTJ film stack 255 is exposed at the bottom of the contact opening 242.

Figure 17:
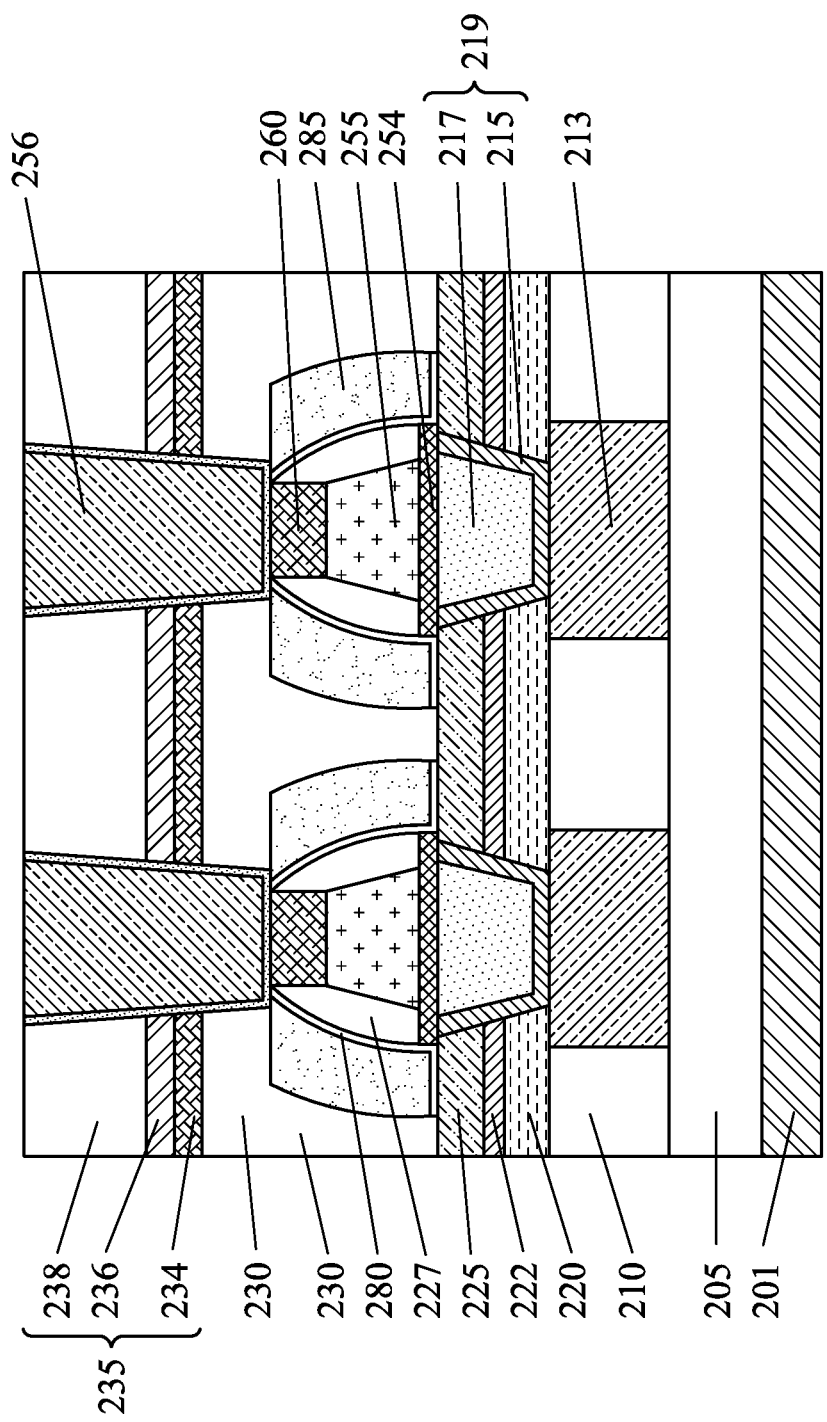

Subsequently, as shown in FIG. 17, the contact openings 242 are filled with a conductive material so as to form conductive contacts 256 contacting the exposed upper surface of the MTJ film stack 255. In some embodiments, the conductive contact 256 includes one or more of liner or barrier layers conformally formed on the inner wall of the contact opening 242 and a body metal layer filling the remaining portion of the contact opening. In some embodiments, the liner or barrier layer is made of Ta, TaN and/or Co, and the body metal layer is made of Cu or a Cu alloy (e.g., AlCu).

In some embodiments, after the third ILD layer 230 is formed and before the fourth ILD layer 235 is formed, one or more metal wiring layers including conductive wiring patterns and via contacts are formed in the logic circuit region.

FIGS. 18-21 show various stages of a sequential manufacturing process of the semiconductor device including an MRAM according to an embodiment of the present disclosure. It is understood that additional operations can be provided before, during, and after processes shown by FIGS. 18-21, and some of the operations described below can be replaced or eliminated, for additional embodiments of the method. Material, configuration, dimensions and/or processes the same as or similar to the foregoing embodiments described with FIGS. 1A-17 may be employed in the following embodiments, and detailed explanation thereof may be omitted.

Figure 18:
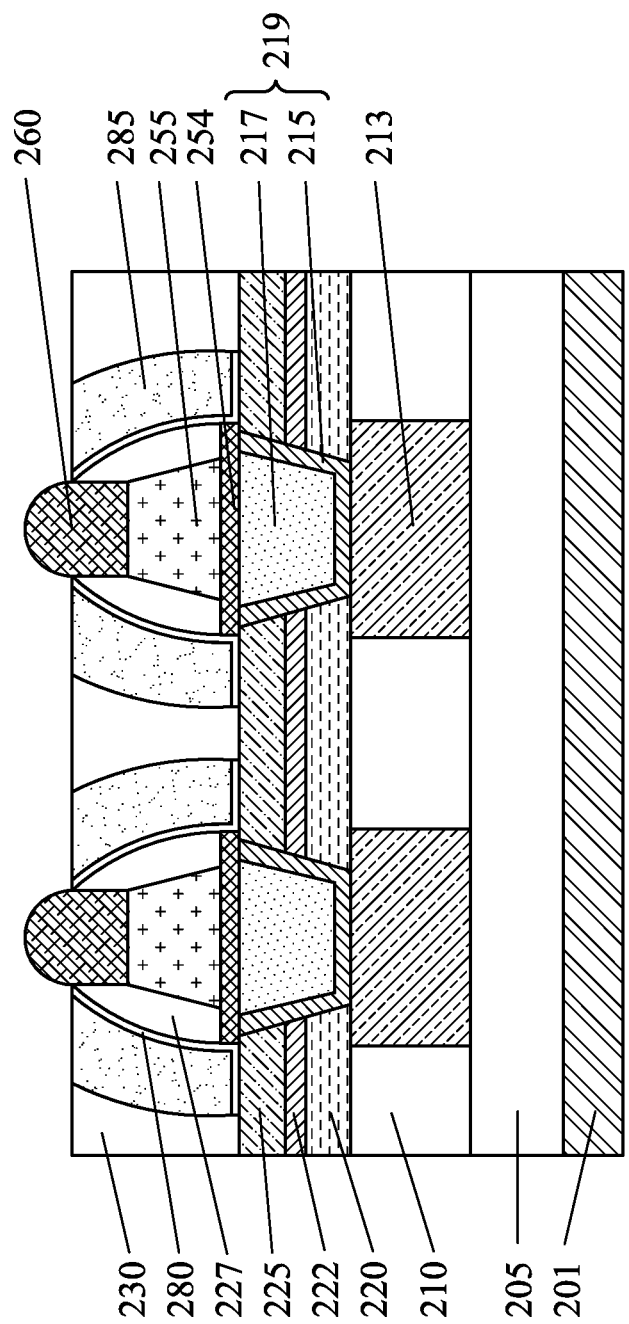
FIGS. 18, 19, 20 and 21 show various stages of a sequential manufacturing process of a semiconductor device including an MRAM according to an embodiment of the present disclosure.
Figure 19:
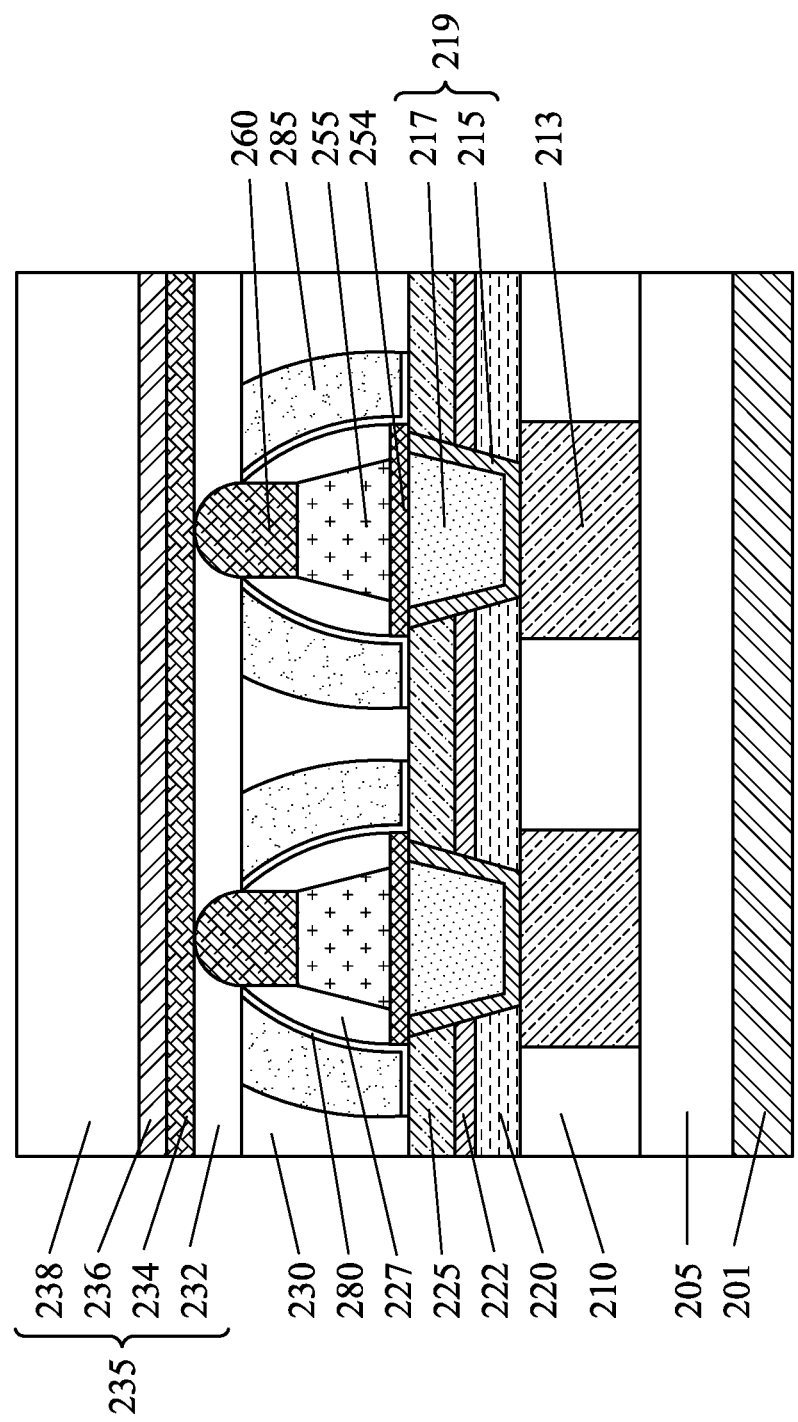

In some embodiments, after the third ILD layer 230 is formed, an etch-back operation is performed to expose an upper part of the hard mask layer 260, as shown in FIG. 18. Then, a dielectric layer for the first dielectric layer 232 of the fourth ILD layer 235 is formed over the hard mask pattern 260 and the third ILD layer 230, and then a CMP operation is performed to at least partially expose the hard mask pattern 260, as shown in FIG. 19. In some embodiments, the CMP operation stops when the top of the hard mask pattern 260 is exposed or stops after the top of the hard mask pattern 260 is exposed with additional over etching. Then, the second to fourth dielectric layers of the fourth ILD layer are formed over the first dielectric layer 232 as shown in FIG. 19.

Figure 20:
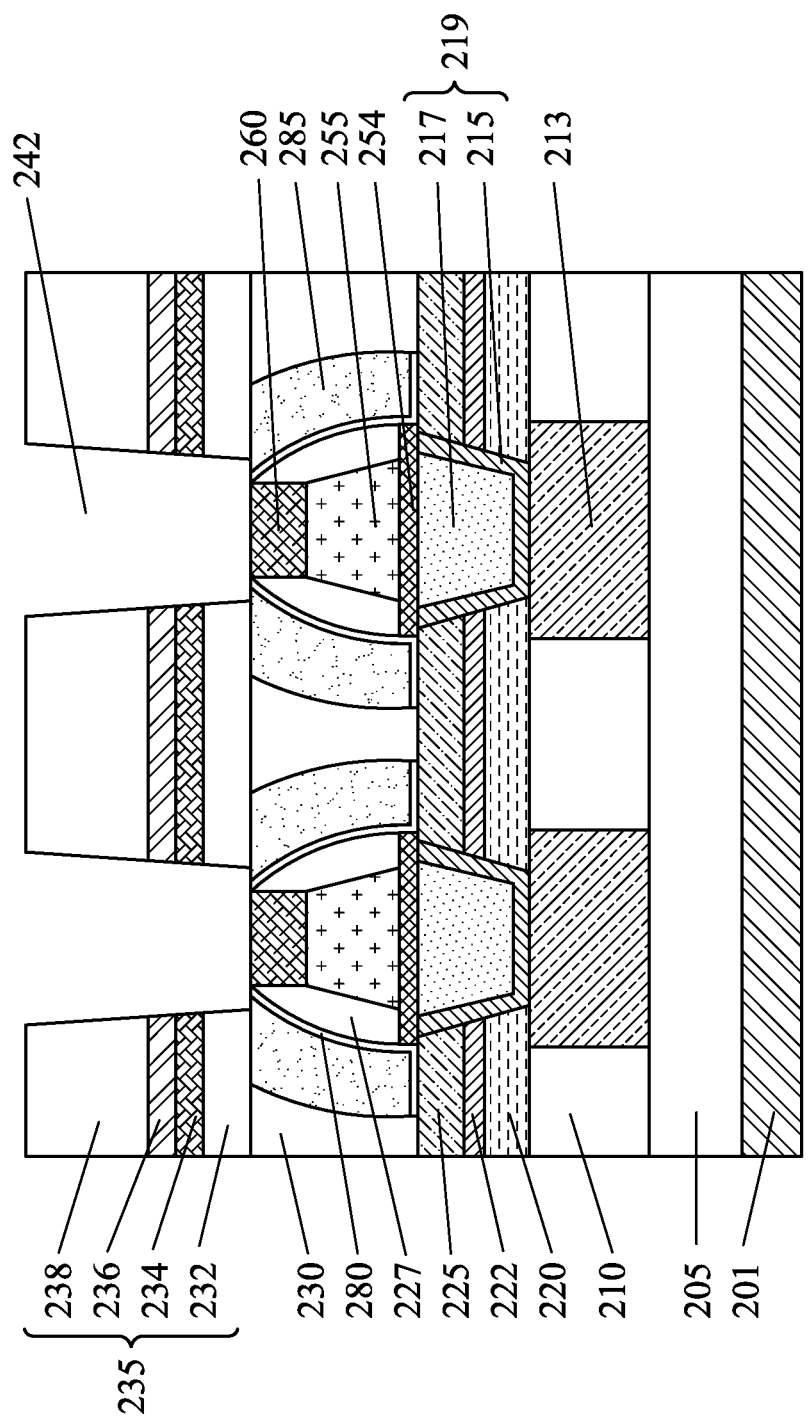
Figure 21:
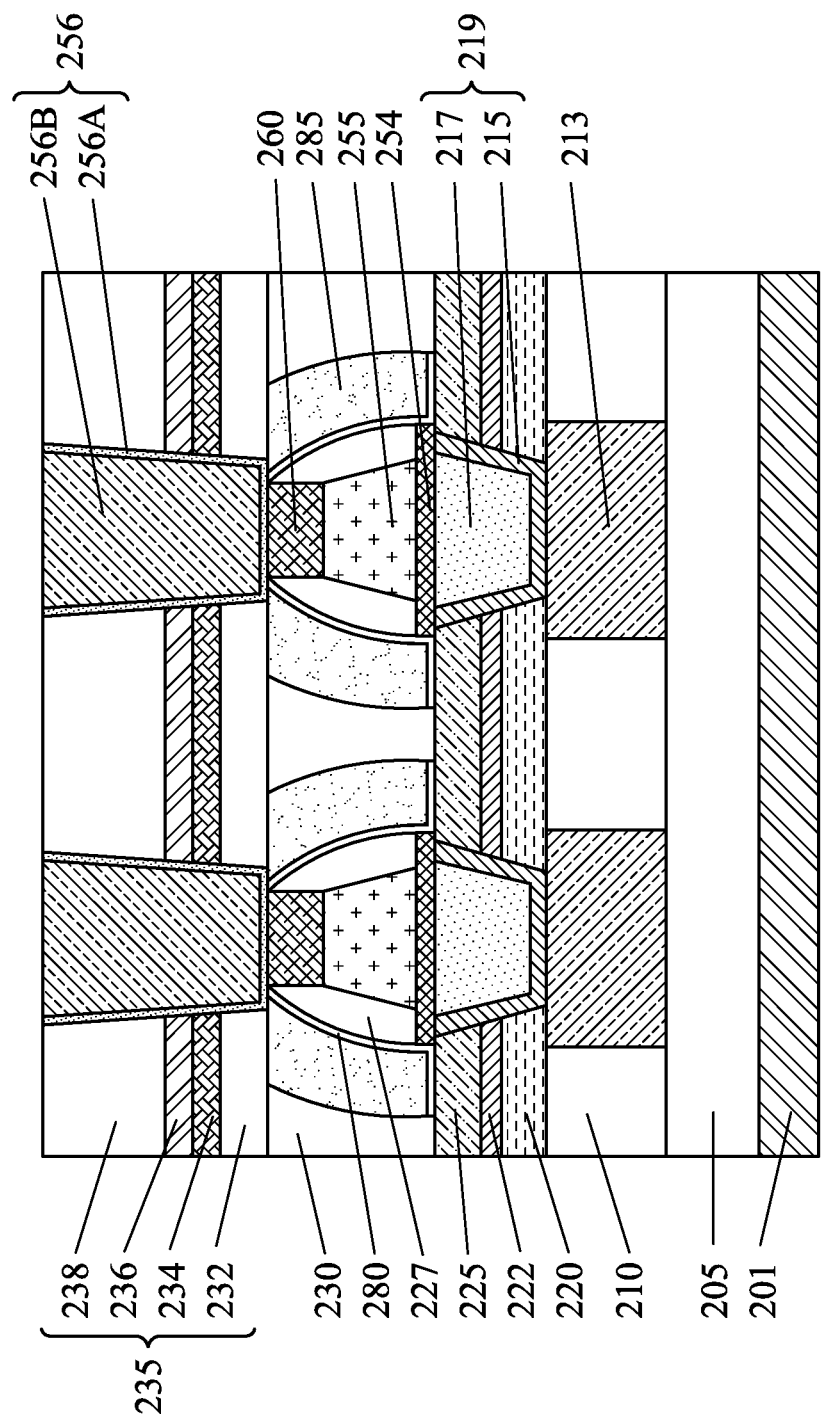

Then, similar to FIGS. 16 and 17, contact openings 242 are formed by using one or more lithography and etching operations as shown in FIG. 20. Subsequently, as shown in FIG. 21, the contact openings 242 are filled with a conductive material so as to form conductive contacts 256 contacting the exposed upper surface of the MTJ film stack 255.

In the embodiments of the present disclosure, during the etching of the first conductive layer for the bottom electrode, the MTJ film stack is covered by the first insulating cover layer (sidewall insulating layer). Accordingly, it is possible to efficiently remove the etching byproducts that may be deposited on the sidewalls by using proper etchant. Since the sidewall insulating layer is made of a dielectric material while the byproduct is metallic, there are many choices of the etchant. Further by using RIE for the etching of the MTJ film stack, it is possible to suppress shadowing effects caused by a high aspect ratio of adjacent cell structures, compared with IBE. Moreover, the present embodiments can suppress the loading effect during the etching between the memory cell region (high pattern density) and the logic circuit region (low pattern density).

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a magnetic random access memory (MRAM) cell, a first layer made of a conductive material is formed over a substrate. A second layer for a magnetic tunnel junction (MTJ) stack is formed over the first conductive layer. A third layer is formed over the second layer. A first hard mask pattern is formed by patterning the third layer. The MTJ stack is formed by patterning the second layer by an etching operation using the first hard mask pattern as an etching mask. The etching operation stops at the first layer. A sidewall insulating layer is formed over the MTJ stack. After the sidewall insulating layer is formed, a bottom electrode is formed by patterning the first layer to form the MRAM cell including the bottom electrode, the MTJ stack and the first hard mask pattern as an upper electrode. In one or more of the foregoing and following embodiments, the conductive material of the first layer is TiN. In one or more of the foregoing and following embodiments, the first hard mask layer is made of TiN. In one or more of the foregoing and following embodiments, the first layer is formed over a first interlayer dielectric (ILD) layer formed over the substrate, and the sidewall insulating layer is not in contact with the first ILD layer. In one or more of the foregoing and following embodiments, in the MRAM cell, a width of the bottom electrode is greater than a largest width of the MTJ stack. In one or more of the foregoing and following embodiments, the sidewall insulating layer is made of silicon nitride. In one or more of the foregoing and following embodiments, in the MRAM cell, a thickness of the bottom electrode is smaller than a thickness of the upper electrode.

In accordance with another aspect of the present disclosure, in a method of manufacturing a semiconductor device including a magnetic random access memory (MRAM) cell, a first interlayer dielectric (ILD) layer is formed over a substrate. A first layer is formed over the first ILD layer. A second layer for a magnetic tunnel junction (MTJ) stack is formed over the first conductive layer. A third layer is formed over the second layer. A first hard mask pattern is formed by patterning the third layer. The MTJ stack is formed by patterning the second layer by an etching operation using the first hard mask pattern as an etching mask. The etching operation stops at the first layer. A first sidewall insulating layer is formed over the MTJ stack. After the first sidewall insulating layer is formed, the first layer is patterned. A second sidewall insulating layer is formed over the first sidewall insulating layer. A third sidewall insulating layer is formed over the second sidewall insulating layer. A second ILD layer is formed, a third ILD layer is formed, a contact opening is formed in the second and third ILD layers, and a conductive layer is formed in the contact opening. In one or more of the foregoing and following embodiments, the first sidewall insulating layer is made of a nitride-based insulating material, and the second sidewall insulating layer is made of an aluminum-based insulating material different from the nitride-based insulating material. In one or more of the foregoing and following embodiments, the nitride-based insulating material is one or more selected from the group consisting of silicon nitride, SiON and SiOCN. In one or more of the foregoing and following embodiments, the nitride-based insulating material is formed at a temperature in a range from 100° C. to 150° C. In one or more of the foregoing and following embodiments, the aluminum-based insulating material is one or more selected from the group consisting of aluminum oxide, aluminum nitride, aluminum oxynitride, aluminum carbide and aluminum oxycarbide. In one or more of the foregoing and following embodiments, the aluminum-based insulating material is formed at a temperature in a range from 300° C. to 450° C. In one or more of the foregoing and following embodiments, the second sidewall insulating layer is in contact with sidewalls of the patterned first layer. In one or more of the foregoing and following embodiments, the sidewall insulating layer is not in contact with the first ILD layer. In one or more of the foregoing and following embodiments, when the third ILD layer is formed, the second ILD layer is partially recessed to expose a part of the hard mask layer, a first dielectric layer is formed over the second ILD layer and the hard mask layer that is exposed, a planarization operation is performed on the first dielectric layer to expose the hard mask layer, and one or more second dielectric layers are formed over the first dielectric layer and the hard mask layer that is exposed.

In accordance with another aspect of the present application, in a method of manufacturing a semiconductor device including a magnetic random access memory (MRAM) cell, a first conductive layer is formed over a first interlayer dielectric (ILD) layer, a stacked layer for a magnetic tunnel junction (MTJ) stack is formed over the first conductive layer, a hard mask pattern is formed over the stacked layer, the stacked layer is patterned by using the hard mask pattern as an etching mask, so as not to expose the first ILD layer, a first insulating cover layer is formed over the patterned stacked layer, the first conductive layer is formed by using the patterned stacked layer with the first insulating cover layer as an etching mask, thereby forming a cell structure including a bottom electrode formed by the first conductive layer, the magnetic tunnel junction (MTJ) stack and an upper electrode formed by the hard mask pattern, a second insulating cover layer and a third insulating cover layer are formed over the cell structure, a second ILD layer is formed, a contact opening is formed in the second ILD layer, and a conductive layer is formed in the contact opening. In one or more of the foregoing and following embodiments, when the first insulating cover layer is formed, a first layer is formed over the patterned stacked layer, a second layer made of a different material than the first layer is formed, and an etch-back operation is performed to exposed the hard mask pattern. In one or more of the foregoing and following embodiments, when the second insulating cover layer and the third insulating cover layer are formed, a first layer for the second insulating layer is formed over the cell structure, a second layer is formed over the first layer, and an etch-back operation is performed to exposed the first ILD layer and the hard mask pattern. In one or more of the foregoing and following embodiments, the second and third insulating cover layer are discontinuous between adjacent cell structures.

In accordance with another aspect of the present disclosure, a semiconductor device including a magnetic random access memory (MRAM) cell, includes: a magnetic random access memory (MRAM) cell structure disposed over a substrate, the MRAM cell structure including a bottom electrode and a magnetic tunnel junction (MTJ) stack; a first insulating cover layer covering sidewalls of the MTJ stack and the bottom electrode; a second insulating cover layer disposed over the first insulating cover layer; a first dielectric layer formed over the second insulating cover layer; a second dielectric layer formed over the first dielectric layer; and a conductive contact formed in the second dielectric layer. A width of the bottom electrode is greater than a largest width of the MTJ stack. In one or more of the foregoing and following embodiments, the first insulting cover layer is made of a nitride-based insulating material, and the second insulting cover layer is made of an aluminum-based insulating material different from the nitride-based insulating material. In one or more of the foregoing and following embodiments, the nitride-based insulating material is one or more selected from the group consisting of SiN, SiON and SiOCN. In one or more of the foregoing and following embodiments, the aluminum-based insulating material is one or more selected from the group consisting of aluminum oxide, aluminum nitride, aluminum oxynitride, aluminum carbide and aluminum oxycarbide. In one or more of the foregoing and following embodiments, the nitride-based insulating material is made of SiN, and the aluminum-based insulating material is one selected from the group consisting of aluminum oxide, aluminum nitride, and aluminum oxynitride. In one or more of the foregoing and following embodiments, the first insulating cover layer is thicker than the second insulting cover layer. In one or more of the foregoing and following embodiments, the semiconductor device further includes a third insulating cover layer disposed between the second insulating cover layer and the first dielectric layer.

In accordance with another aspect of the present disclosure, a semiconductor device including a magnetic random access memory (MRAM) cell, includes: a lower electrode formed in an first interlayer dielectric (ILD) layer disposed over a substrate; a magnetic random access memory (MRAM) cell structure disposed on the lower electrode, the MRAM cell structure including a bottom electrode and a magnetic tunnel junction (MTJ) stack; a first insulating cover layer covering sidewalls of the MTJ stack and the bottom electrode; a second insulating cover layer disposed over the first insulating cover layer; a dielectric layer disposed over the second insulating cover layer; and a conductive contact formed in the dielectric layer. The first insulating cover layer is not in contact with the first ILD layer. In one or more of the foregoing and following embodiments, the first insulating cover layer is separated from the first ILD layer by the bottom electrode. In one or more of the foregoing and following embodiments, the bottom electrode is made of TiN. In one or more of the foregoing and following embodiments, the semiconductor device further includes a third insulating cover layer disposed between the second insulating cover layer and the dielectric layer. In one or more of the foregoing and following embodiments, the third insulating cover layer is not in contact with the first ILD layer. In one or more of the foregoing and following embodiments, the width of the bottom electrode is greater than a largest width of the lower electrode. In one or more of the foregoing and following embodiments, the MRAM cell structure further includes an upper electrode, and the first insulating cover layer covers a part of a side face of the upper electrode. In one or more of the foregoing and following embodiments, the second insulating cover layer is in contact with a side face of the bottom electrode.

In accordance with another aspect of the present disclosure, a semiconductor device including a magnetic random access memory (MRAM) cell, includes: first and second magnetic random access memory (MRAM) cell structures disposed over a substrate, each of the first and second MRAM cell structures including a bottom electrode, a magnetic tunnel junction (MTJ) stack and an upper electrode; a first insulating cover layer covering sidewalls of each of the first and second MRAM cell structures; a second insulating cover layer disposed over the first insulating cover layer; a bottom dielectric layer filling a space between the first and second MRAM cell structures; and an upper dielectric layer disposed over the bottom dielectric layer. The first insulating cover layer is discontinuous between the first MRAM cell structure and the second MRAM cell structure, and the second insulating cover layer is discontinuous between the first MRAM cell structure and the second MRAM cell structure. In one or more of the foregoing and following embodiments, the semiconductor device further includes a common conductive contact in contact with the upper electrode of the first and second MRAM cell structures. In one or more of the foregoing and following embodiments, the first insulating cover layer is made of silicon nitride, and the second insulating cover layer is made of aluminum oxide. In one or more of the foregoing and following embodiments, the semiconductor device further includes a third insulating cover layer disposed over the second insulating cover layer and discontinuous between the first MRAM cell structure and the second MRAM cell structure. In one or more of the foregoing and following embodiments, the lower dielectric layer is in contact with a bottom dielectric layer disposed below the second insulating cover layer, and the third insulating cover layer is not in contact with the bottom dielectric layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a magnetic random access memory (MRAM) cell, the method comprising:
    forming a first layer made of a conductive material over a substrate, wherein the conductive material of the first layer is TiN;
    forming a second layer for a magnetic tunnel junction (MTJ) stack over the first layer;
    forming a third layer over the second layer;
    forming a first hard mask pattern by patterning the third layer;
    forming the MTJ stack by patterning the second layer by an etching operation using the first hard mask pattern as an etching mask, wherein the etching operation stops at a top surface of the first layer;
    forming a sidewall insulating layer over the MTJ stack; and
    after the sidewall insulating layer is formed, forming a bottom electrode by patterning the first layer to form the MRAM cell including the bottom electrode, the MTJ stack and the first hard mask pattern as a top electrode, wherein the sidewall insulating layer and the bottom electrode are formed by a same anisotropic plasma dry etching operation, the bottom electrode is a planar electrode having a first uniform thickness across a width of the bottom electrode and the width of the bottom electrode is smaller than a largest width of a via contact formed under the bottom electrode, and the top electrode has a second uniform thickness across a width of the top electrode greater than the first uniform thickness of the bottom electrode.

2. The method of claim 1, wherein the first hard mask pattern is made of TiN.

3. The method of claim 1, wherein:
    the first layer is formed over a first interlayer dielectric (ILD) layer formed over the substrate, and
    the sidewall insulating layer is not in contact with the first ILD layer.

4. The method of claim 1, wherein in the MRAM cell, the width of the bottom electrode is greater than a largest width of the MTJ stack.

5. The method of claim 1, wherein the sidewall insulating layer is made of silicon nitride.

6. The method of claim 1, wherein the sidewall insulating layer includes:
    a first sidewall insulating layer formed over the MTJ stack;
    a second sidewall insulating layer formed over the first sidewall insulating layer; and
    a third sidewall insulating layer formed over the second sidewall insulating layer.

7. The method of claim 6, wherein:
    the first layer is formed over a first interlayer dielectric (ILD) layer formed over the substrate.

8. The method of claim 7, wherein:
    the second sidewall insulating layer is in contact with the first ILD layer.

9. A method of manufacturing a semiconductor device including a magnetic random access memory (MRAM) cell, the method comprising:
    forming a first interlayer dielectric (ILD) layer over a substrate;
    forming a first layer over the first ILD layer;
    forming a second layer for a magnetic tunnel junction (MTJ) stack over the first layer;
    forming a third layer over the second layer;
    forming a first hard mask pattern by patterning the third layer;
    forming the MTJ stack by patterning the second layer by an etching operation using the first hard mask pattern as an etching mask, wherein the etching operation stops at a top surface of the first layer;
    forming a first sidewall insulating layer over the MTJ stack;
    after the first sidewall insulating layer is formed, patterning the first layer, wherein the patterned first layer is a planar electrode having a first uniform thickness across a width of the patterned first layer, the width of the patterned first layer is smaller than a largest width of a via contact formed under the patterned first layer, and the first hard mask pattern has a second uniform thickness across a width of the first hard mask pattern greater than the first uniform thickness of the patterned first layer;
    forming a second sidewall insulating layer over the first sidewall insulating layer;
    forming a third sidewall insulating layer over the second sidewall insulating layer;
    forming a second ILD layer;
    forming a third ILD layer, wherein the forming the third ILD layer comprises:
        partially recessing the second ILD layer to expose a part of the first hard mask pattern;
        forming a first dielectric layer over the second ILD layer and the first hard mask pattern that is exposed;

performing a planarization operation on the first dielectric layer to expose the first hard mask pattern; and forming one or more second dielectric layers over the first dielectric layer and the first hard mask pattern that is exposed;

forming a contact opening in the second and third ILD layers to remove a top portion of the first hard mask pattern, wherein a remaining portion of the first hard mask pattern has a rectangular shape in a cross-sectional view; and forming a conductive layer in the contact opening.

10. The method of claim 9, wherein:

the first sidewall insulating layer is made of a nitride-based insulating material, and the second sidewall insulating layer is made of an aluminum-based insulating material different from the nitride-based insulating material.

11. The method of claim 10, wherein the nitride-based insulating material is one or more selected from the group consisting of silicon nitride, SiON and SiOCN.

12. The method of claim 11, wherein the nitride-based insulating material is formed at a temperature in a range from 100° C. to 150° C.

13. The method of claim 10, wherein the aluminum-based insulating material is one or more selected from the group consisting of aluminum oxide, aluminum nitride, aluminum oxynitride, aluminum carbide and aluminum oxycarbide.

14. The method of claim 13, wherein the aluminum-based insulating material is formed at a temperature in a range from 300° C. to 450° C.

15. The method of claim 9, wherein the second sidewall insulating layer is in contact with sidewalls of the patterned first layer.

16. The method of claim 9, wherein the first sidewall insulating layer is not in contact with the first ILD layer.

17. The method of claim 9, wherein:

the first hard mask pattern is made of TiN, and the second sidewall insulating layer is in contact with the first ILD layer.

18. The method of claim 9, wherein:

the third sidewall insulating layer is separated from the first ILD layer by the second sidewall insulating layer.

19. The method of claim 9, wherein in the MRAM cell, the width of the patterned first layer is greater than a largest width of the MTJ stack.

20. The method of claim 9, wherein the first sidewall insulating layer is made of silicon nitride.

* * * * *